(12) United States Patent
Chang et al.

(10) Patent No.: US 12,068,394 B2
(45) Date of Patent: Aug. 20, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chia-Wei Chang, Taichung (TW); Chiung Wen Hsu, Tainan (TW); Yu-Ting Weng, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 488 days.

(21) Appl. No.: 17/306,120

(22) Filed: May 3, 2021

(65) Prior Publication Data

US 2021/0257484 A1 Aug. 19, 2021

Related U.S. Application Data

(60) Continuation of application No. 16/544,826, filed on Aug. 19, 2019, now Pat. No. 10,998,427, which is a
(Continued)

(51) Int. Cl.
*H01L 29/78* (2006.01)
*H01L 21/3065* (2006.01)
(Continued)

(52) U.S. Cl.
CPC .... *H01L 29/66795* (2013.01); *H01L 21/3065* (2013.01); *H01L 21/30655* (2013.01);
(Continued)

(58) Field of Classification Search
None
See application file for complete search history.

(56) References Cited

U.S. PATENT DOCUMENTS 8,941,214 B2 1/2015 Sell
2007/0281455 A1 12/2007 Kim
(Continued)

FOREIGN PATENT DOCUMENTS

KR 10-2005-0006836 A 1/2005
TW 201543691 A 11/2015

OTHER PUBLICATIONS

K. Cheng et al., "Bottom Oxidation through STI (BOTS)—A Novel Approach to Fabricate Dielectric Isolated FinFETs on Bulk Substrates", 2014 Symposium on VLSI Technology Digest of Technical Papers, IEEE, pp. 1-2.
(Continued)

*Primary Examiner* — Benjamin P Sandvik
(74) *Attorney, Agent, or Firm* — STUDEBAKER & BRACKETT PC

(57) ABSTRACT

A semiconductor device includes a substrate, a fin structure protruding from the substrate, a gate insulating layer covering a channel region formed of the fin structure, a gate electrode layer covering the gate insulating layer, and isolation layers disposed on opposite sides of the fin structure. The fin structure includes a bottom portion, a neck portion, and a top portion sequentially disposed on the substrate. A width of the neck portion is less than a width of the bottom portion and a width of a portion of the top portion.

20 Claims, 24 Drawing Sheets

Related U.S. Application Data division of application No. 15/725,710, filed on Oct. 5, 2017, now Pat. No. 10,388,763.

(60) Provisional application No. 62/434,819, filed on Dec. 15, 2016.

(51) Int. Cl.
*H01L 21/308* (2006.01)
*H01L 21/311* (2006.01)
*H01L 21/762* (2006.01)
*H01L 29/66* (2006.01)

(52) U.S. Cl.
CPC .... *H01L 21/3085* (2013.01); *H01L 21/31116* (2013.01); *H01L 21/76232* (2013.01); *H01L 29/785* (2013.01); *H01L 29/7851* (2013.01); *H01L 29/7853* (2013.01)

(56) References Cited

U.S. PATENT DOCUMENTS

| | | | |
|---|---|---|---|
| 2008/0023755 A1 | 1/2008 | Lee | |
| 2008/0119020 A1* | 5/2008 | Grisham | H01L 21/76232 257/E21.549 |
| 2008/0160700 A1 | 7/2008 | Lee | |
| 2008/0230832 A1 | 9/2008 | Cho | |
| 2011/0006365 A1 | 1/2011 | Ananthan | |
| 2011/0081764 A1 | 4/2011 | Maszara et al. | |
| 2013/0221448 A1* | 8/2013 | Chang | H01L 29/66795 438/701 |
| 2014/0225197 A1 | 8/2014 | Huang et al. | |
| 2015/0187571 A1* | 7/2015 | Fan | H01L 29/165 438/282 |
| 2015/0206939 A1 | 7/2015 | Huang et al. | |
| 2015/0236123 A1 | 8/2015 | Chang et al. | |
| 2015/0303192 A1 | 10/2015 | Zhu | |
| 2015/0340290 A1 | 11/2015 | Zhu | |
| 2016/0027684 A1 | 1/2016 | Chang et al. | |
| 2016/0133624 A1 | 5/2016 | Liao | |
| 2016/0315193 A1 | 10/2016 | Kim et al. | |
| 2016/0336451 A1* | 11/2016 | Li | H01L 29/7853 |
| 2016/0365426 A1 | 12/2016 | Ching et al. | |
| 2017/0110558 A1 | 4/2017 | Lee et al. | |
| 2017/0263715 A1 | 9/2017 | Bouche et al. | |
| 2018/0090491 A1 | 3/2018 | Huang et al. | |
| 2018/0175173 A1 | 6/2018 | Chang et al. | |
| 2019/0043763 A1 | 2/2019 | Li et al. | |
| 2019/0157160 A1* | 5/2019 | Lu | H01L 21/3086 |
| 2021/0091222 A1* | 3/2021 | Chu | H01L 29/7851 |
| 2021/0305375 A1* | 9/2021 | Kim | H01L 29/7851 |

OTHER PUBLICATIONS

F.A. Khaja et al., "Bulk FinFET Junction Isolation by Heavy Species and Thermal Implants", 2014 20th International Conference on Thermal Ion Implantation Technology, pp. 1-4.

A.J. Strojwas, "Is the Bulk vs. SOI Battle Over?", 2013 International Symposium on VLSI Technology, Systems and Applications, IEEE, pp. 1-2.

Office Action issued in corrresponding Korean Patent Application No. 10-2017-0163409, dated Feb. 28, 2019.

Notice of Allowance issued in corresponding Korean Patent Application No. 10-2017-0163409, dated Dec. 6, 2019.

Non-Final Office Action issued in related U.S. Appl. No. 16/544,826, dated Jun. 25, 2020.

Notice of Allowance issued in related U.S. Appl. No. 16/544,826, dated Jan. 1, 2021.

* cited by examiner

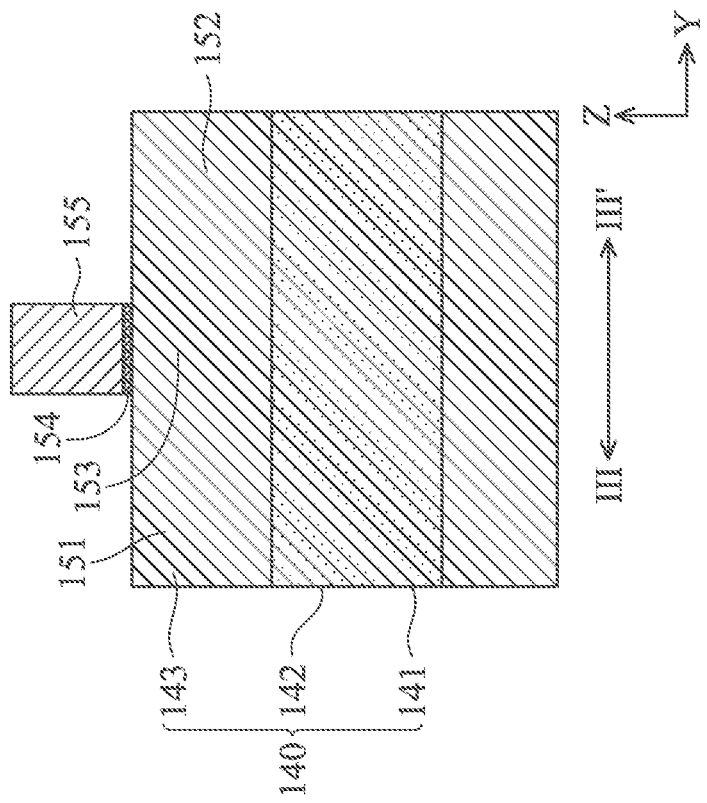
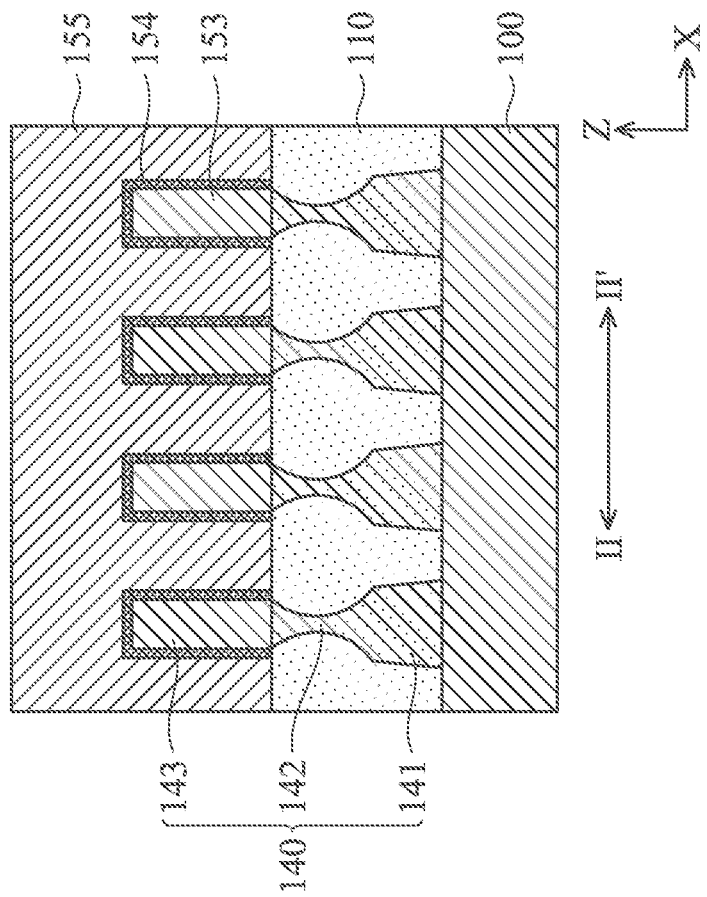
FIG. 3
FIG. 2

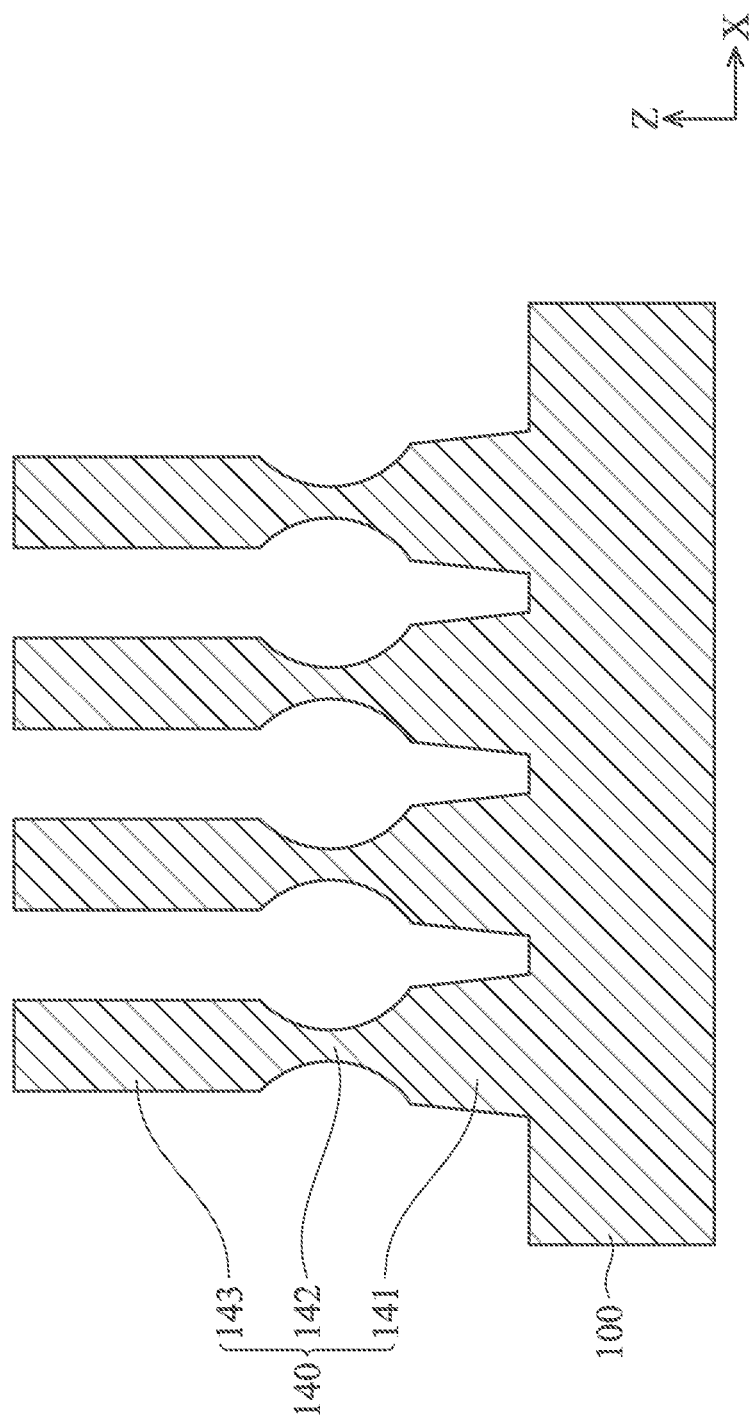

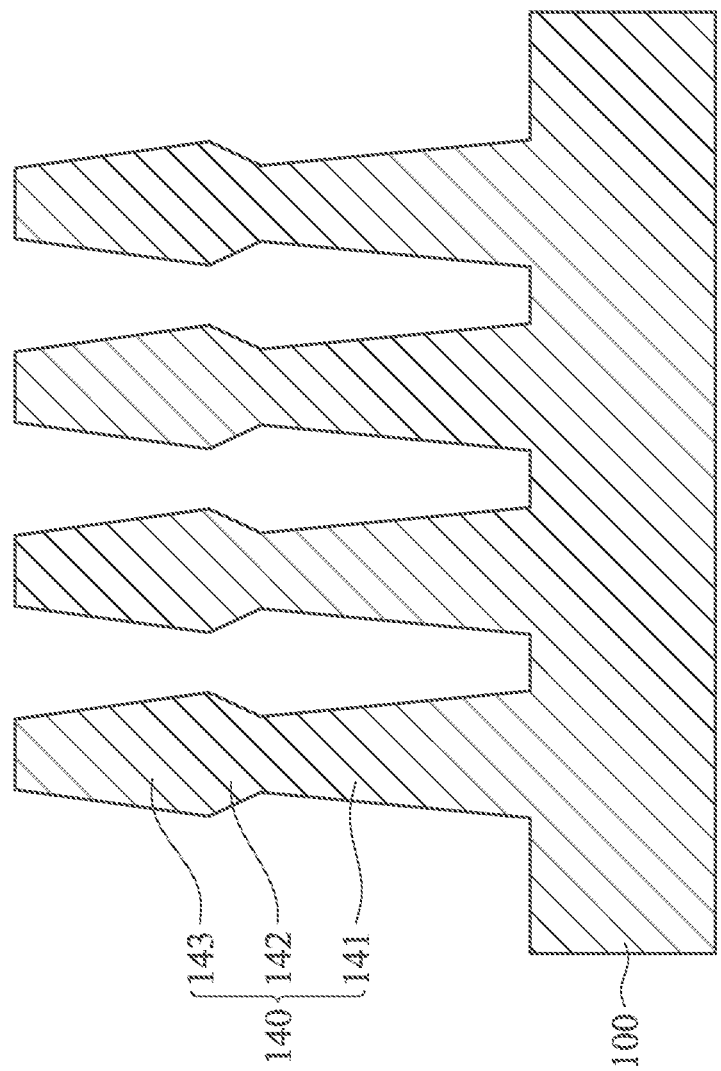

SEMICONDUCTOR DEVICE AND MANUFACTURING METHOD THEREOF

PRIORITY CLAIM AND CROSS-REFERENCE

This application is a Continuation Application of U.S. application Ser. No. 16/544,826, filed Aug. 19, 2019, which is a Divisional Application of U.S. application Ser. No. 15/725,710, filed Oct. 5, 2017, now U.S. Pat. No. 10,388,763, which claims priority to U.S. Provisional Application No. 62/434,819, filed Dec. 15, 2016, entitled "SEMICONDUCTOR DEVICE INCLUDING FIN HAVING NECK PORTION AND MANUFACTURING METHOD THEREOF," the entire disclosures of each of which are incorporated herein by reference.

TECHNICAL FIELD

Embodiments of the present disclosure are related to a semiconductor fin, a semiconductor device, and a method of forming the same.

BACKGROUND

In a fin field-effect transistor (FinFET), current leakage in a region below a channel region of the FinFET in a bottom portion of a fin structure should be prevented or suppressed.

To reduce current leakage, a Silicon-On-Insulator (SOI) substrate, which is much more expensive than a traditional silicon substrate, may be used such that a buried oxide layer of the SOI substrate can be used to isolate the source and drain regions.

Alternatively, a punch-through stopper or an oxide layer may be buried below the channel region so as to increase resistivity thereof, thereby reducing current leakage. However, forming a punch-through stopper below the channel region and forming an oxide layer below the channel region are complicated and difficult to control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-sectional schematic view of the FinFET shown in FIG. 1, taken along plane II-II' shown in FIG. 1.

FIG. 3 is a cross-sectional schematic view of the FinFET shown in FIG. 1, taken along plane III-III' shown in FIG. 1.

FIG. 6G shows a process step to manufacture the semiconductor fin structure shown in FIG. 4.

FIG. 9E shows a process step to manufacture the semiconductor fin structure shown in FIG. 5.

DETAILED DESCRIPTION

Figure 1:
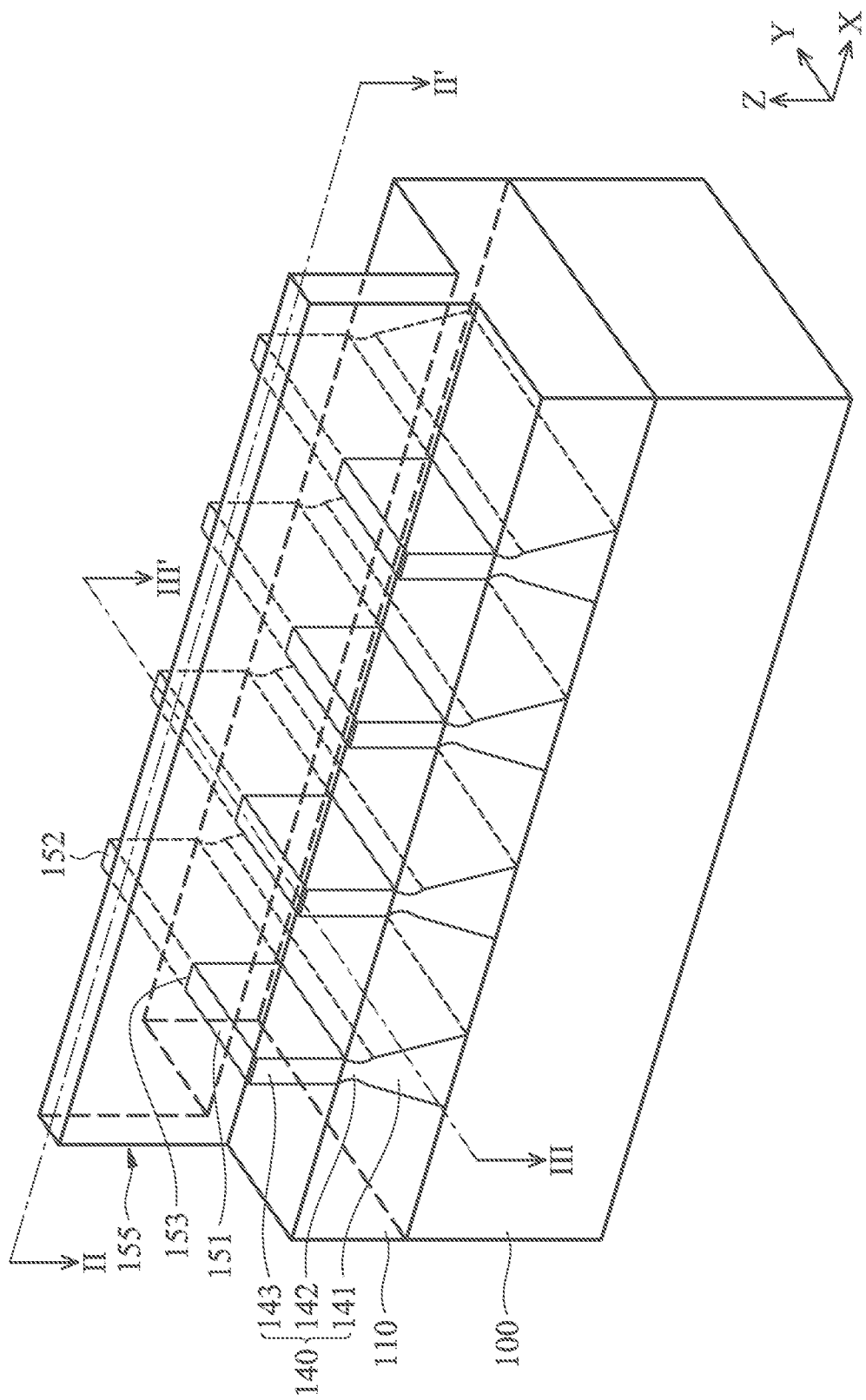
FIG. 1 shows a three-dimensional schematic view of a fin field-effect transistor (FinFET) according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, a layer, a pattern, or a structure extending in one direction means that a dimension of the layer, the pattern, or the structure in the extended one direction is greater than another dimension of the layer, the pattern, or the structure in another dimension substantially perpendicular to the extended one direction.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected or undesirable design, manufacturing, and measurement conditions.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected or undesirable design, manufacturing, and measurement conditions.

In the entire disclosure, "about" or "approximately" used to describe a parameter means that design error/margin, manufacturing error/margin, measurement error etc. are considered to define the parameter. Such a description should be recognizable to one of ordinary skill in the art.

In the entire disclosure, layers/patterns/structures being formed of substantially the same material means that the layers/patterns/structures are formed of the same material or the layers/patterns/structures are originally formed of the same material but can have impurities having the same or different types with the same or different concentrations doped later in order to implement a semiconductor device.

FIG. 1 shows a three-dimensional schematic view of a fin field-effect transistor (FinFET) according to embodiments of the present disclosure, and FIGS. 2 and 3 are cross-sectional schematic views of the FinFET shown in FIG. 1, taken along planes II-II' and III-III' shown in FIG. 1, respectively. Planes II-II' and III-III' each are perpendicular to an upper surface P (shown in FIG. 4) of a substrate 100. For convenience of explanation, the cross-sectional view shown in FIG. 2 is simplified in FIG. 4, in which only the substrate 100 and a semiconductor fin structure 140 are illustrated.

Referring to FIGS. 1-4, the FinFET according to embodiments of the present disclosure includes a source region 151, a drain region 152, a channel region 153 disposed between the source region 151 and the drain region 152, a gate electrode 155, and a gate insulating layer 154 (shown in FIGS. 2 and 3 but omitted in FIG. 1) interposed between the gate electrode 155 and the channel region 153. The source region 151, the drain region 152, and the channel region 153 are made by an upper portion of the semiconductor fin structure 140 protruding from a substrate 100. In some embodiments, the regions denoted by reference numerals 151 and 152 can be recessed (or removed) and other semiconductor materials can be grown in the recessed regions by epitaxy. In some embodiments, impurities can be doped into the regions grown by epitaxy to form the source and drain regions 151 and 152. One of ordinary skill in the art should understand that the source and drain regions 151 and 152, if formed by a recess process followed by an epitaxy process, can have a structure different from those shown in FIG. 1.

The substrate 100 can be a semiconductor substrate formed of, for example, one of Si, Ge, SiGe, SiC, SiP, SiPC, InP, InAs, GaAs, AlInAs, InGaP, InGaAs, GaAsSb, GaPN, AlPN, and any other suitable material. The semiconductor fin structure 140 can be formed by removing portions of the substrate 100 on opposite sides of a region corresponding to the semiconductor fin structure 140. Such features will be more apparent with reference to FIGS. 6A-7F to be described later. In this case, the semiconductor fin structure 140 can be formed of substantially the same material as the substrate 100.

In other embodiments, the semiconductor fin structure 140 can be made of a device layer of a silicon-on-insulator (SOI). In this case, portions of the device layer are removed and an intermediate portion between the portions to be removed remains and becomes the semiconductor fin structure 140.

Alternatively, the semiconductor fin structure 140 can be grown on the substrate 100 by epitaxy, and in this case, the semiconductor fin structure 140 can be formed of a material substantially the same as, or different from, that of the substrate 100.

Referring to FIGS. 1-4, a lower portion, denoted by reference numerals 141 and 142, of the semiconductor fin structure 140 is buried inside isolation layers 110 formed over the substrate 100. The isolation layers 110 are Shallow Trench Isolation (STI) as an example to be described next. The present disclosure, however, is not limited thereto. The isolation layers 110 can be field oxide regions, according to another embodiment. The isolation layers 110 are made of $SiO_2$, $Si_3N_4$, SiON, a combination thereof, or any other suitable material.

The source region 151, the drain region 152, and the channel region 153 of the FinFET are made of the upper portion of the semiconductor fin structure 140 on a level above the isolation layers 110. The source and drain regions 151 and 152 are heavily doped and may contain impurities having a concentration in a range from about $5 \times 10^{19}$ to $1 \times 10^{20}$ cm$^{-3}$, while the channel region 153 is undoped or lightly doped in some embodiments.

The gate electrode 155 made of, for example, tungsten and/or other work function metals, is formed over the channel region 153, and extends to cover sidewalls of the channel region 130 and to cover portions of the isolation layers 110. The gate insulating layer 154, interposed between the gate electrode 155 and the channel region 153, is formed of, for example, a high-k dielectric material such as a metal oxide including an oxide of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, a combination thereof, or any other suitable material. In some embodiments, the gate insulating layer 154 can further include an interfacial dielectric layer formed of, for example, $SiO_2$, $Si_3N_4$, SiON, a combination thereof, or any other suitable material, interposed between the high-k dielectric material of the gate insulating layer 154 and the channel region 153.

Although not shown in the drawings, the FinFET can further include an interlayer dielectric layer formed over the isolation layers 110 to fill other spaces on a level of the gate electrode 155 not occupied by the gate electrode 155, and the FinFET can also include source and drain contacts penetrating through the interlayer dielectric layer so as to electrically connected to the source and drain regions 151 and 152, respectively.

Referring to FIGS. 1 and 2, the FinFET includes four semiconductor fin structures 140 extending along Y direction, and the gate electrode 155 extending continuously along X direction, substantially perpendicular to Y direction, to cover channel regions 153 of respective semiconductor fin structures 140. In this case, the source contacts (not shown) penetrating through the interlayer dielectric layer (not shown) and electrically connected to respective source regions 151 can be electrically connected to each other by, for example, one or more metal layers (not shown) and/or one or more vias (not shown) formed on a level above the source contacts (not shown). Similarly, the drain contacts (not shown) penetrating through the interlayer dielectric layer and electrically connected to respective drain regions 152 can be electrically connected to each other by, for example, the one or more metal layers (not shown) and/or the one or more vias (not shown) formed on a level above the drain contacts (not shown).

One of ordinary skill in the art should understand that the FinFET having four semiconductor fin structures 140 shown in FIGS. 1 and 2 is an example and a number of the semiconductor fin structures for forming the FinFET should not limited thereto. In some embodiments, the FinFET can be formed of a single semiconductor fin structure 140, or two, three, five, or more semiconductor fin structures 140 arranged substantially parallel to each other, according to design particulars.

Referring to FIGS. 1-4, the semiconductor fin structure 140 includes a bottom portion 141, a middle portion 142, and a top portion 143 sequentially disposed on each other in Z direction. The middle portion 142, i.e., a portion of the semiconductor fin structure 140 between the bottom and top portions 141 and 143, has a width in X direction smaller than a width in the X direction of an uppermost portion of the bottom portion 141 and a width in the X direction of a lowermost portion of the top portion 143. The middle portion 142 will be described as a neck portion 142 hereinafter.

Figure 4:
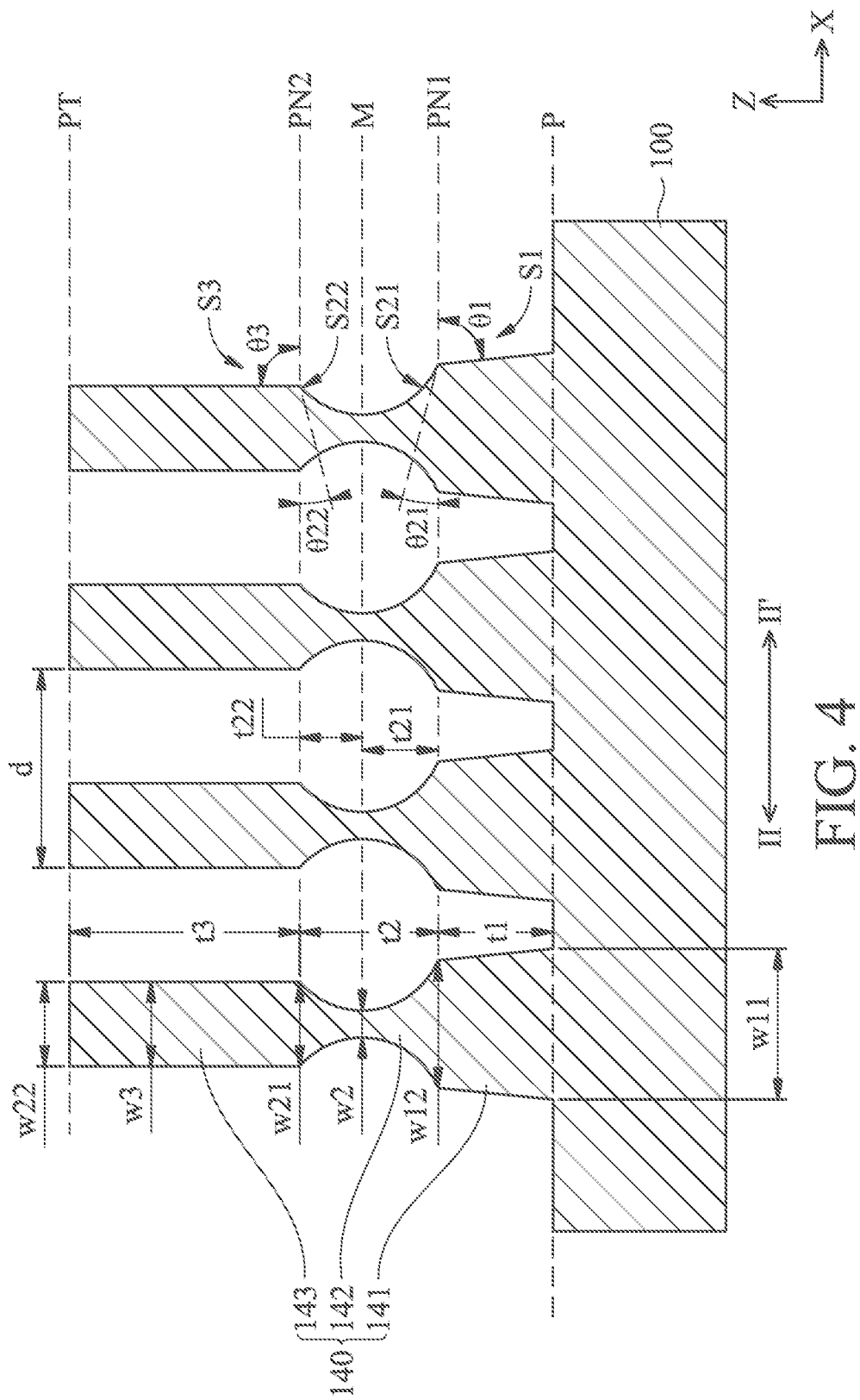
FIG. 4 is a cross-sectional view of a semiconductor fin structure according to embodiments of the present disclosure.

Referring to FIGS. 1, 2, and 4, the semiconductor fin structure 140 protrudes from the upper surface P of the substrate 100. The bottom portion 141 of the semiconductor fin structure 140 is defined to be a portion of the semiconductor fin structure 140 from the upper surface P of the semiconductor substrate 100 to a first neck plane PN1. Here, a side surface S1 of a portion immediately (or directly) below the first neck plane PN1 in Z direction and a side surface S21 of a portion immediately (or directly) above the first neck plane PN1 in Z direction have different curvatures in X-Z plane. For example, the side surface S1 of the portion immediately below the first neck plane PN1 is almost flat as shown in FIGS. 1, 2, and 4 and thus has a curvature smaller than a curvature of an arcuate/curved surface, for example, a curvature of the side surface S21 of the portion immediately above the first neck plane PN1 in the Z direction.

The top portion 143 of the semiconductor fin structure 140 is defined to be a portion of the semiconductor fin structure 140 from an upper surface PT of the semiconductor fin structure 140 to a second neck plane PN2. Here, a side surface S3 of a portion immediately (or directly) above the second neck plane PN2 in Z direction and a side surface S22 of a portion immediately (or directly) below the second neck plane PN2 in Z direction have different curvatures in X-Z plane. For example, the side surface S3 of the portion immediately above the second neck plane PN2 is almost a flat surface as shown in FIGS. 1, 2, and 4 and thus has a curvature smaller than a curvature of a curved surface, for example, a curvature of the side surface S22 of the portion immediately below the second neck plane PN2 in the Z direction.

The top surface PT of the semiconductor fin structure 140, the first neck plane PN1, and the second neck plane PN2 each can be substantially parallel to the upper surface P of the substrate 100.

The first neck plane PN1 can coincide with a boundary or an interface between the neck portion 142 of the semiconductor fin structure 140 and the bottom portion 141 of the semiconductor fin structure 140. In some embodiments, $\theta 1$ is greater than $\theta 21$, in which $\theta 1$ is an angle between the side surface S1 of the portion immediately below the first neck plane PN1 in Z direction and the first neck plane PN1, and $\theta 21$ is an angle of a plane tangent to the side surface S21 of a portion immediately above the first neck plane PN1 in Z direction and the first neck plane PN1. Similarly, $\theta 3$ is greater than $\theta 22$, in which $\theta 3$ is an angle between the side surface S3 of the portion immediately above the second neck plane PN2 in Z direction and the second neck plane PN2, and $\theta 22$ is an angle of a plane tangent to the side surface S22 of a portion immediately below the second neck plane PN2 in Z direction and the second neck plane PN2. In this disclosure, an angle between a surface (or plane) and another surface (or plane) refers to a right angle or an acute angle therebetween and not an obtuse angle therebetween.

In some embodiments, the portion of the bottom portion 141 of the semiconductor fin structure 140 immediately (or directly) below the first neck plane PN1 or the portion of the semiconductor fin structure 140 aligned to the first neck plane PN1 has a width w12 in X direction greater than any portion of the neck portion 142. A portion of the bottom portion 141 of the semiconductor fin structure 140 immediately (or directly) above the upper surface P of the semiconductor has a width w11 in X direction, greater than the width w12. The present disclosure, however, is not limited thereto. In other embodiments, the width w12 can be the same as or greater than the width 11.

In some embodiments, the neck portion 142 includes a portion having a width w2 in X direction smaller than a width in X direction of any other portion of the neck portion 142. In this disclosure, the portion of the neck portion 142 having the smallest width w2 is defined to be aligned to a plane M substantially parallel to the upper surface P of the substrate 100. In some embodiments, the width w2 is smaller than a width in X direction of any portion of the bottom portion 141.

As shown in FIG. 4, in a case in which the side surfaces of the top portion 143 are substantially perpendicular to the upper surface P of the substrate 100, the top portion 143 of the semiconductor fin structure 140 has a width w3 in X direction greater than a width of any portion of the neck portion 142 from the plane M to the second neck plane PN2 and ultimately greater than the width w2. Although as illustrated in FIG. 4, the entire side surface of the side surface of the top portion 143 of the semiconductor fin structure 143 is configured to be substantially perpendicular to the second neck plane PN2, the present disclosure is not limited thereto. In other embodiments, the width w3 of the top portion 143 of the semiconductor fin structure 140 can gradually increase or decrease in Z direction. In a case in which the width w3 of the top portion 143 of the semiconductor fin structure 140 gradually decreases in Z direction, the width w2, i.e., the smallest width in X direction of the entire neck portion 142 of the semiconductor fin structure 140, can be greater than a width w22 of the uppermost portion of the semiconductor fin structure 140. In some embodiments, the width w2 is the smallest width in X direction of the entire semiconductor fin structure 140. One of ordinary skill in the art should understand that in a case in which the uppermost portion has a curved outline at the top in X-Z plane, rather than a flat surface at the top, the width 22 can be defined at a portion having a predetermined distance, for example, about 10 nm, from the peak point which has the greatest distance to the upper surface P of the substrate 100 than a distance of any other portion of the semiconductor fin structure 140 to the upper surface P of the substrate 100.

In some embodiments, the width w2 is from about 2 nm to about 11 nm. In a case in which the width w2 is from about 2 nm to about 11 nm, below-channel leakage of the FinFET can be prevented or suppressed by the reduced width w2, as compared to a comparative example in which no such neck portion is included, since electrons and/or holes are hampered to pass through when the width of the semiconductor fin structure is reduced at the neck portion. In a case in which the width w12 is from about 2 nm to about 11 nm, the semiconductor fin structure 140 can have sufficient mechanical strength such that damage to the semiconductor fin structure 140 in manufacturing can be avoided.

In a case in which the width w2 is smaller than about 2 nm, although prevention or suppression of the below-channel leakage can be maintained or can even be improved, the semiconductor fin structure 140 becomes fragile due to further narrowing the width w2 and the semiconductor fin structure 140 thus may be broken due to external impact or force during manufacturing.

In a case in which the width w2 is greater than about 11 nm, prevention or suppression of the below-channel current leakage may not be effective, and thus, performance of the FinFET may not be improved.

The width w22 in X direction of the uppermost portion of the semiconductor fin structure 140 can be from about 3 nm to about 10 nm; the present disclosure, however, is not limited thereto. A width w21 in X direction of the semiconductor fin structure 140 at the second neck plane PN2 can be from about 3 nm to about 13 nm; the present disclosure, however, is not limited thereto.

In some embodiments, a ratio of the width w22 in X direction of the uppermost portion of the semiconductor fin structure 140 to the width w21 in X direction of the semiconductor fin structure 140 at the second neck plane PN2 is greater than about 90%, and a ratio of the width w2 to the width w21 in X direction of the semiconductor fin structure 140 at the second neck plane PN2 is about 50% to about 95%.

To prevent the semiconductor fin structure 140 from being broken by, for example, external force or impact during manufacturing, the width of the bottom portion 141 of the semiconductor fin structure 140 can be greater than the remaining portion of the semiconductor fin structure 140.

A thickness t1 of the bottom portion 141 of the semiconductor fin structure 140 can be about 40 nm to about 100 nm to prevent current leakage.

A thickness t2 of the neck portion 142 of the semiconductor fin structure 140 can be about 6 nm to about 14 nm. A thickness t21, defined to be a distance between the first neck plane PN1 and the plane M, is about 3 nm to about 7 nm, and a thickness t22, defined to be a distance between the second neck plane PN2 and the plane M, can be the same as the thickness t21 and be about 3 nm to about 7 nm. When the thickness t21 and/or the thickness t22 is formed to be less than about 3 nm, due to insufficient etching in Z direction to form the neck portion 142 which causes an insufficient undercut in X direction (forming the neck portion 142 by etching will be described later with reference to FIGS. 6D and 7D), the width w2 may be greater than about 11 nm. On the other hand, when the thickness t21 and/or the thickness t22 is formed to be greater than about 7 nm, due to over etching in Z direction to form the neck portion (to be described later with reference to FIGS. 6D and 7D) which causes an over undercut in X direction, the width w2 may be less than about 2 nm.

A thickness t3 of the top portion 143 of the semiconductor fin structure 140 can be from about 10 nm to about 80 nm, dependent on design particulars. In a case in which the thickness t3 is less than about 10 nm, performance of the FinFET may be deteriorated due to a reduced area for forming a conductive channel during an operation of the FinFET. On the other hand, in a case in which the thickness t3 is greater than about 80 nm, the semiconductor fin structure 140 becomes fragile and may be broken due to external force or impact occurred in manufacturing.

A pitch d between two immediately adjacent semiconductor fin structures 140 in X direction is from about 10 nm to about 32 nm, dependent on design particulars.

One of ordinary skill in the art should appreciate that the first and second neck planes PN1 and PN2 and the plane M are virtual planes and the semiconductor fin structure 140 is not physically or mechanically divided by such virtual planes.

Referring to FIGS. 1-3, the isolation layers 110 can cover at least the portion of the neck portion 142 having the smallest width of the entire neck portion 142 located at the plane M. In some embodiment, the isolation layers 110 can cover at least the entire neck portion 142. In some embodiments, the isolation layers 110 can also cover a bottom portion of the top portion of 143. Thus, the portion of the neck portion 142 having the smallest width of the entire neck portion 142 is covered by the isolation layers 110, but not covered by a gate structure including the gate insulating layer 154 and the gate electrode 155. Accordingly, the portion of the neck portion 142 having the smallest width of the entire neck portion 142 does not act as the channel region of the FinFET but can prevent or suppress the below-channel current.

In some embodiments, at least the neck portion 142 and the top portion 143 of the semiconductor fin structure 140 are formed of substantially the same material including one of Si, Ge, SiGe, SiC, SiP, SiPC, InP, InAs, GaAs, AlInAs, InGaP, InGaAs, GaAsSb, GaPN, AlPN, and any other suitable material, and the bottom portion 141 of the semiconductor fin structure 140 can be formed of substantially the same material as, or different from, that for forming the neck portion 142 and the top portion 143 of the semiconductor fin structure 140. In some embodiments, the semiconductor fin structure 140 and the substrate 100 are formed of substantially the same material including one of Si, Ge, SiGe, SiC, SiP, SiPC, InP, InAs, GaAs, AlInAs, InGaP, InGaAs, GaAsSb, GaPN, AlPN, and any other suitable material, although the present disclosure is not limited thereto. In some embodiments, the bottom portion 141, the neck portion 142, and the top portion 143 of the semiconductor fin structure 140 are formed of substantially the same material including one of Si, Ge, SiGe, SiC, SiP, SiPC, InP, InAs, GaAs, AlInAs, InGaP, InGaAs, GaAsSb, GaPN, AlPN, and any other suitable material, and the substrate 100 is formed of another of Si, Ge, SiGe, SiC, SiP, SiPC, InP, InAs, GaAs, AlInAs, InGaP, InGaAs, GaAsSb, GaPN, AlPN, and any other suitable material, although the present disclosure is not limited thereto.

Figure 5:
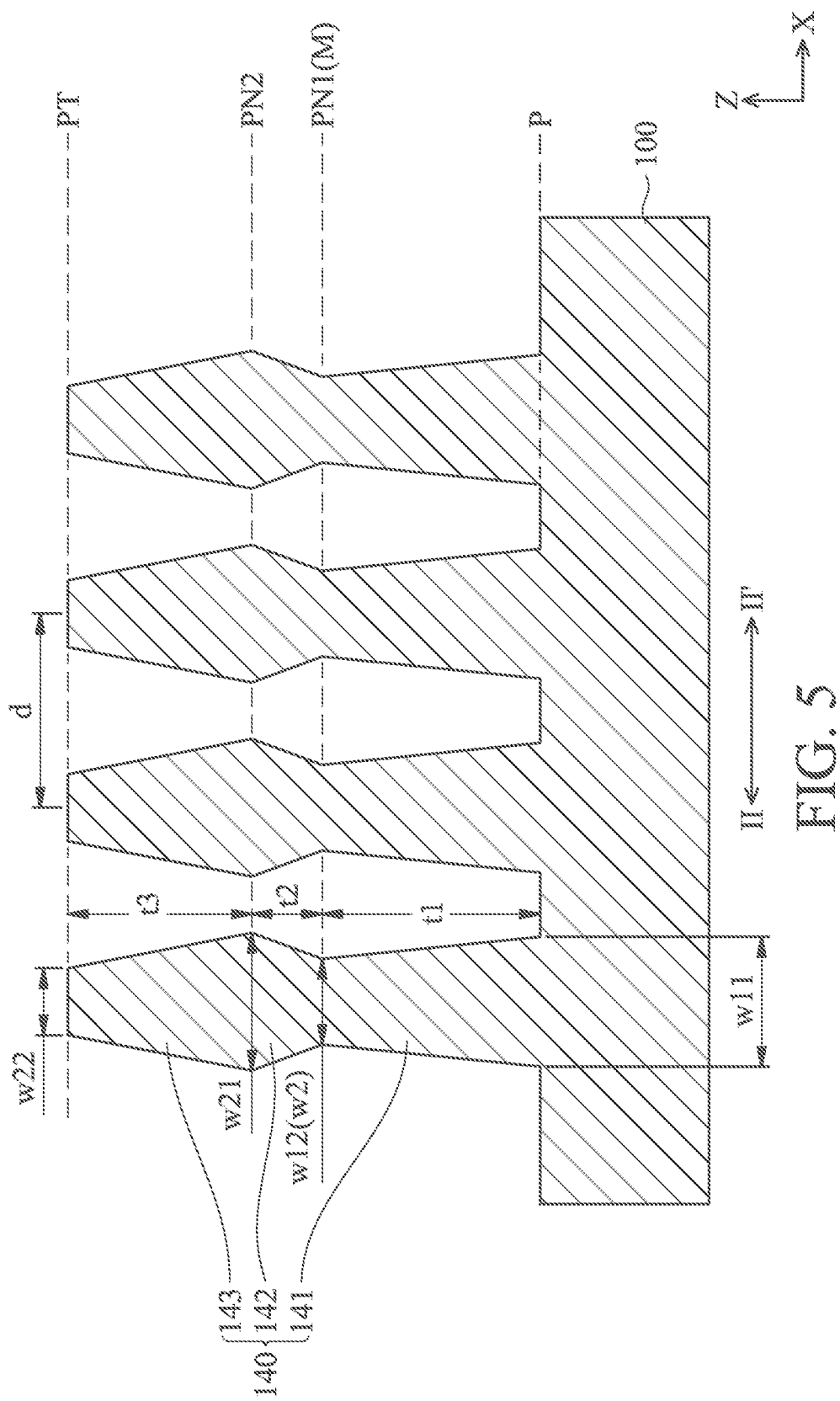
FIG. 5 shows a cross-sectional view of a semiconductor fin structure according to other embodiments of the present disclosure.

FIG. 5 shows a cross-sectional view of a semiconductor fin structure according to other embodiments of the present disclosure.

The same reference numeral shown in FIGS. 4 and 5 represents the same or similar element having the same feature. To avoid redundancy, overlapped descriptions will be omitted here and the features shown in FIG. 5 different from those shown in FIG. 4 will be described next. One of ordinary skill in the art should understand that the semiconductor fin structure shown in FIG. 5 can also be used to implement a FinFET when additional elements denoted by reference numeral 110 and 151 through 155 shown in FIGS. 1-3 are formed.

Referring to FIG. 5, the semiconductor fin structure 140 includes the bottom portion 141 having a width in X direction decreasing from w11 to w12 from the upper surface P of the substrate 100 to the first neck plane PN1, the neck portion having a width in X direction increasing from w12 to w21 from the first neck plane PN1 to the second neck plane PN2, and the top portion 143 having a width in X direction decreasing from w21 to w22 from the second neck plane PN2 to the upper surface PT. Thus, a width w12 in X direction at the level of the first neck plane PN1 is smaller than a width of any other portion of the bottom portion 141 and a width of any other portion of the neck portion 142 of the semiconductor fin structure 140. In this case, if given the same definition, the plane M shown in FIG. 4, which is used to define the location of the portion of the neck portion 142 having the smallest width than the remaining portion of the neck portion 142, coincides with the first neck plane PN1. The width w22 of the uppermost portion of the top portion 143 can be the same as, smaller than, or greater than the width w21 of the lowermost portion of the top portion 143, dependent on design particulars.

In some embodiments, the width w12 is from about 2 nm to about 11 nm. In a case in which the width w12 is from about 2 nm to about 11 nm, below-channel current leakage can be prevented or suppressed due to the reduced width w12, as compared to a comparative example in which no such neck portion is included in a respective semiconductor fin structure, since electrons and/or holes are hampered to pass through when a width of the fin structure is reduced at the neck portion. In a case in which the width w12 is from about 2 nm to about 11 nm, the semiconductor fin structure 140 can have sufficient mechanical strength such that damage to the semiconductor fin structure 140 in manufacturing can be avoided.

In a case in which the width w12 is smaller than about 2 nm, although prevention or suppression of the below-channel current leakage can be maintained or even be improved, the semiconductor fin structure 140 becomes fragile due to further narrowing the width w12 (w2) and the semiconductor fin structure 140 thus may be broken due to external impact or force during manufacturing.

In a case in which the width w12 (w2) is greater than about 11 nm, prevention or suppression of the below-channel current leakage may not be effective, and thus, performance of the FinFET may not be improved.

The width w22 of the uppermost portion of the top portion 143 of the semiconductor fin structure 140 in X direction can be from about 3 nm to about 10 nm; the present disclosure, however, is not limited thereto. The width w21 of the semiconductor fin structure 140 at the second neck plane PN2 in X direction can be from about 3 nm to about 13 nm; the present disclosure, however, is not limited thereto.

In some embodiments, a ratio of the width w22 of the uppermost portion of the top portion 143 of the semiconductor fin structure 140 in X direction to the width w21 of the semiconductor fin structure 140 at the second neck plane PN2 in X direction is greater than about 90%, and a ratio of the width w12 (w2) at the first neck plane PN1 (plane M) in X direction to the width w21 of the semiconductor fin structure 140 at the second neck plane PN2 in X direction is about 50% to about 95%.

As described above, the semiconductor fin 140 includes the bottom portion 141, the neck portion 142, and the top portion 143. The present disclosure, however, should not be limited thereto. In other embodiments, the bottom portion 141 can be omitted. In this case, the neck portion 142 can protrude directly from the upper surface P of the substrate 100.

FIGS. 6A-6H show process steps to manufacture the semiconductor fin structure shown in FIG. 4. For convenience of description, a silicon based semiconductor substrate and a silicon based semiconductor fin structure protruding from the silicon based semiconductor substrate will be described next. One of ordinary skill in the art, however, should appreciate that the substrate should not be limited to silicon, and that the semiconductor fin structure can be formed of a semiconductor material other than silicon by modifying the process conditions and applied materials to be described below.

Figure 6A:
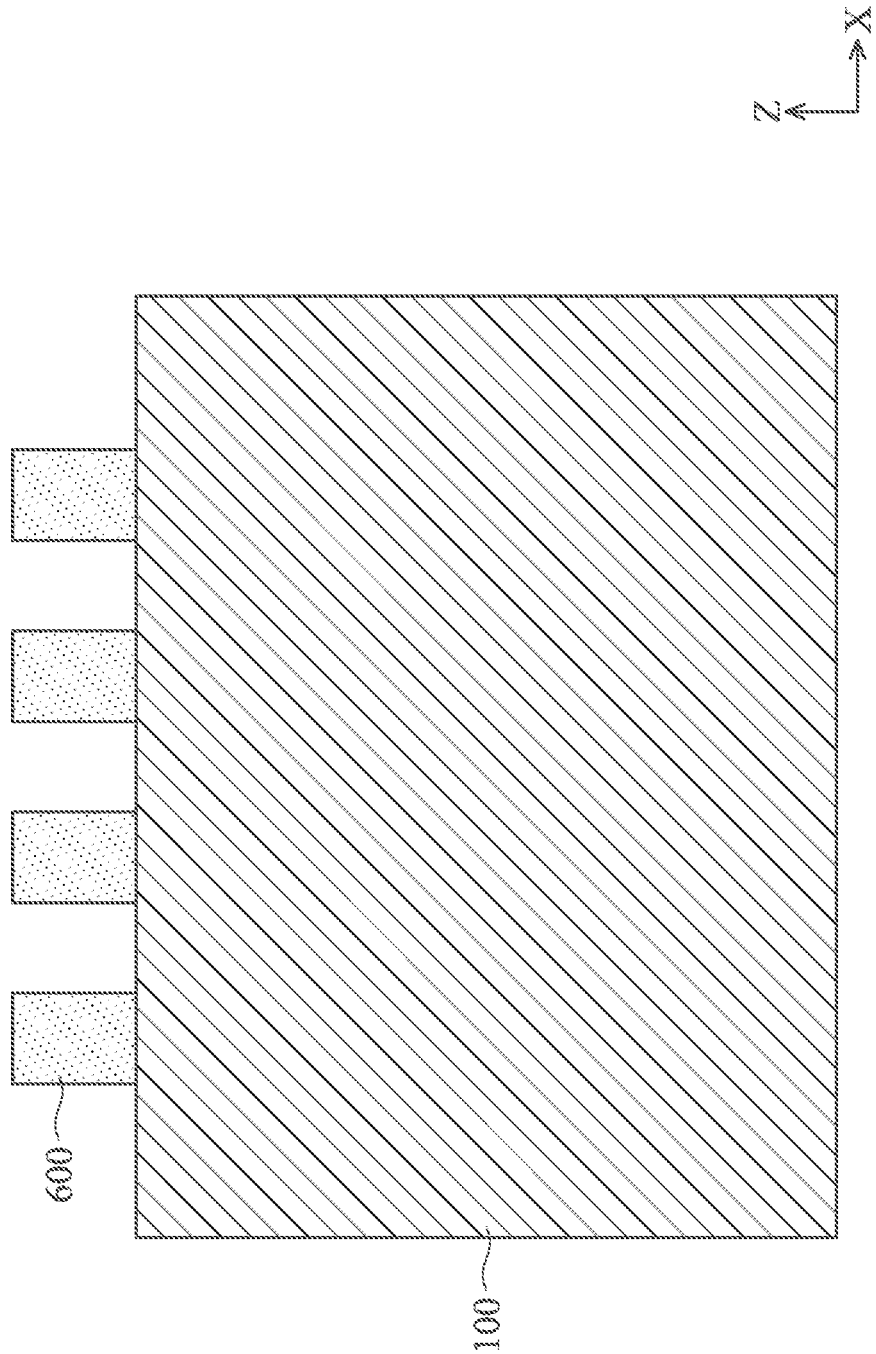
FIG. 6A shows a process step to manufacture the semiconductor fin structure shown in FIG. 4.

As shown in FIG. 6A, a hardmask layer 600 including one of a $SiO_2$ layer, a $Si_3N_4$ layer, and a SiON layer, or a combination thereof disposed on the substrate 100 which, for example, is a silicon substrate, is patterned.

Figure 6B:
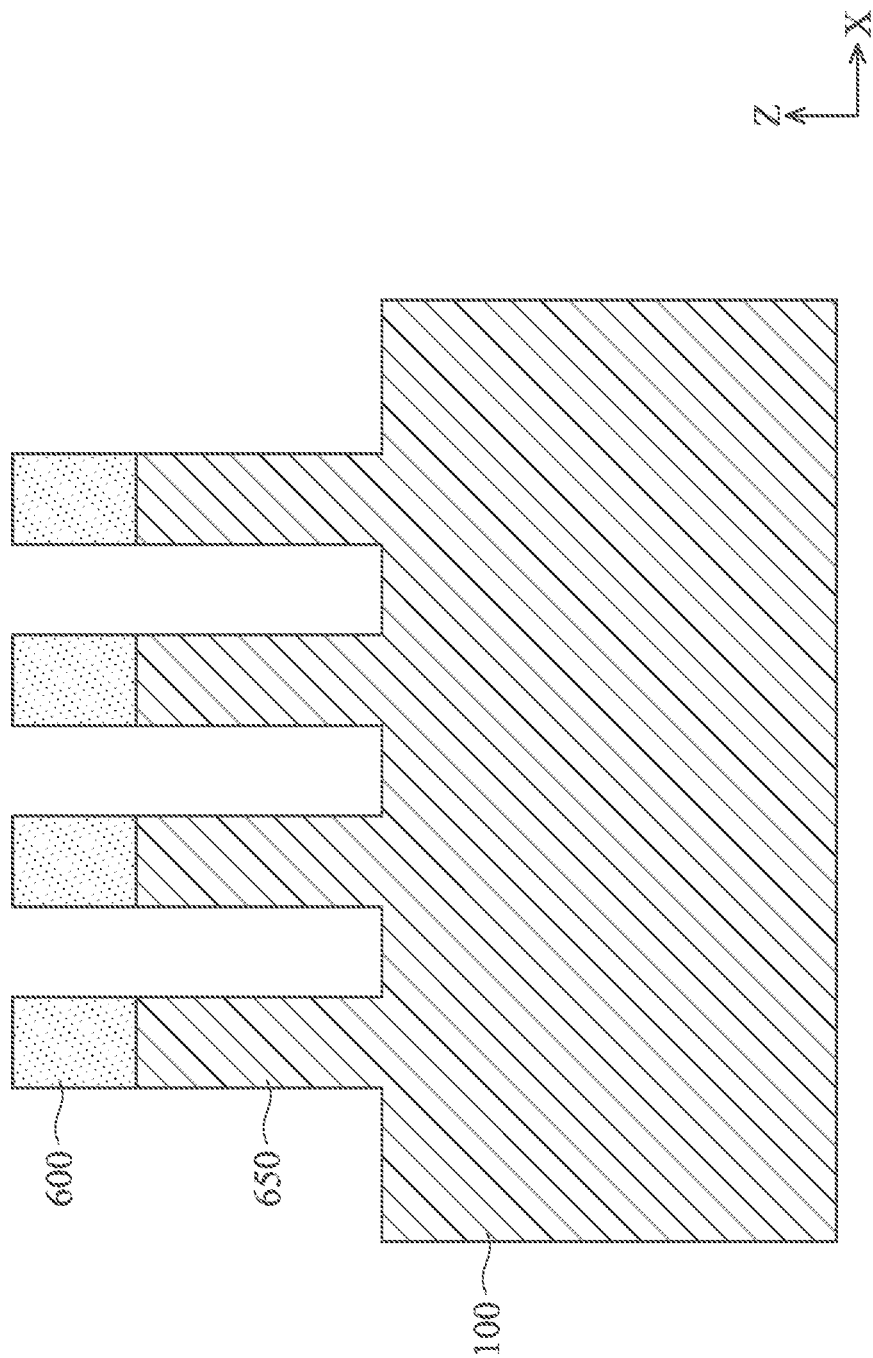
FIG. 6B shows a process step to manufacture the semiconductor fin structure shown in FIG. 4.

Thereafter, as shown in FIG. 6B, the top portion 650 is formed by plasma etching of the substrate 100 using $CF_4$, $SF_6$, $CH_2F_2$, HBr, $Cl_2$, and/or $O_2$ with a predetermined ratio (pressure from about 10 mTorr to about 200 mTorr, source power from about 300 W to about 1000 W, and bias power from about 500 W to about 2000 W) with the hardmask layer 600 as a plasma etching mask layer.

In some embodiments, the top portions 650 of the fins may be patterned by other suitable methods. For example, the top portions 650 of fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 6C:
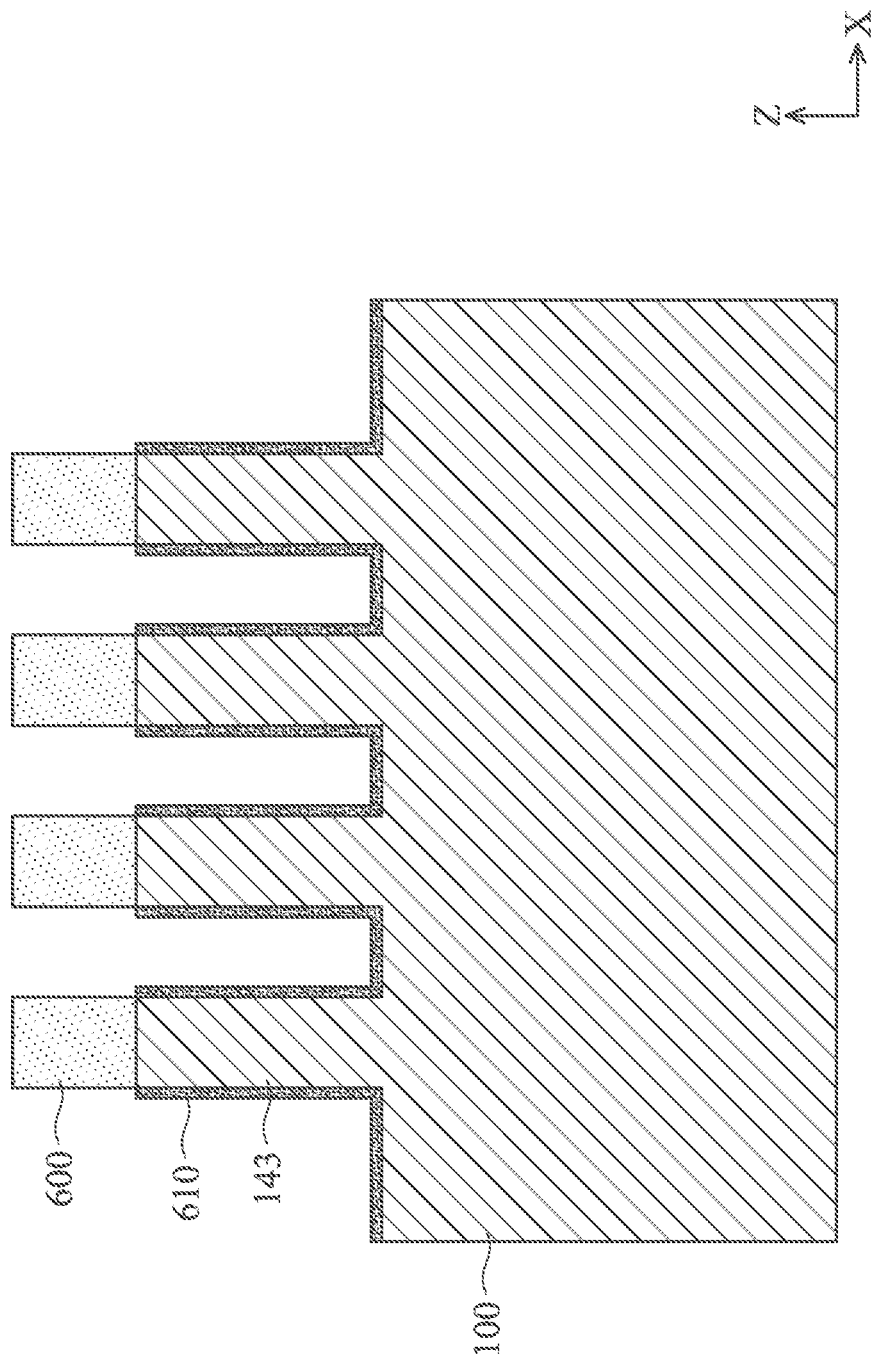
FIG. 6C shows a process step to manufacture the semiconductor fin structure shown in FIG. 4.

Next, as shown in FIG. 6C, another mask layer 610, for example, a $SiO_2$ layer, is formed, for example, by oxygen plasma oxidation (pressure about 10 mTorr to about 20 mTorr, source power from about 600 W to about 800 W, and bias power from about 0 W to about 100 W), to cover at least the surface of the substrate 100 and the side surfaces of the top portion 143 exposed by the plasma etching performed with reference to FIG. 6B.

Figure 6D:
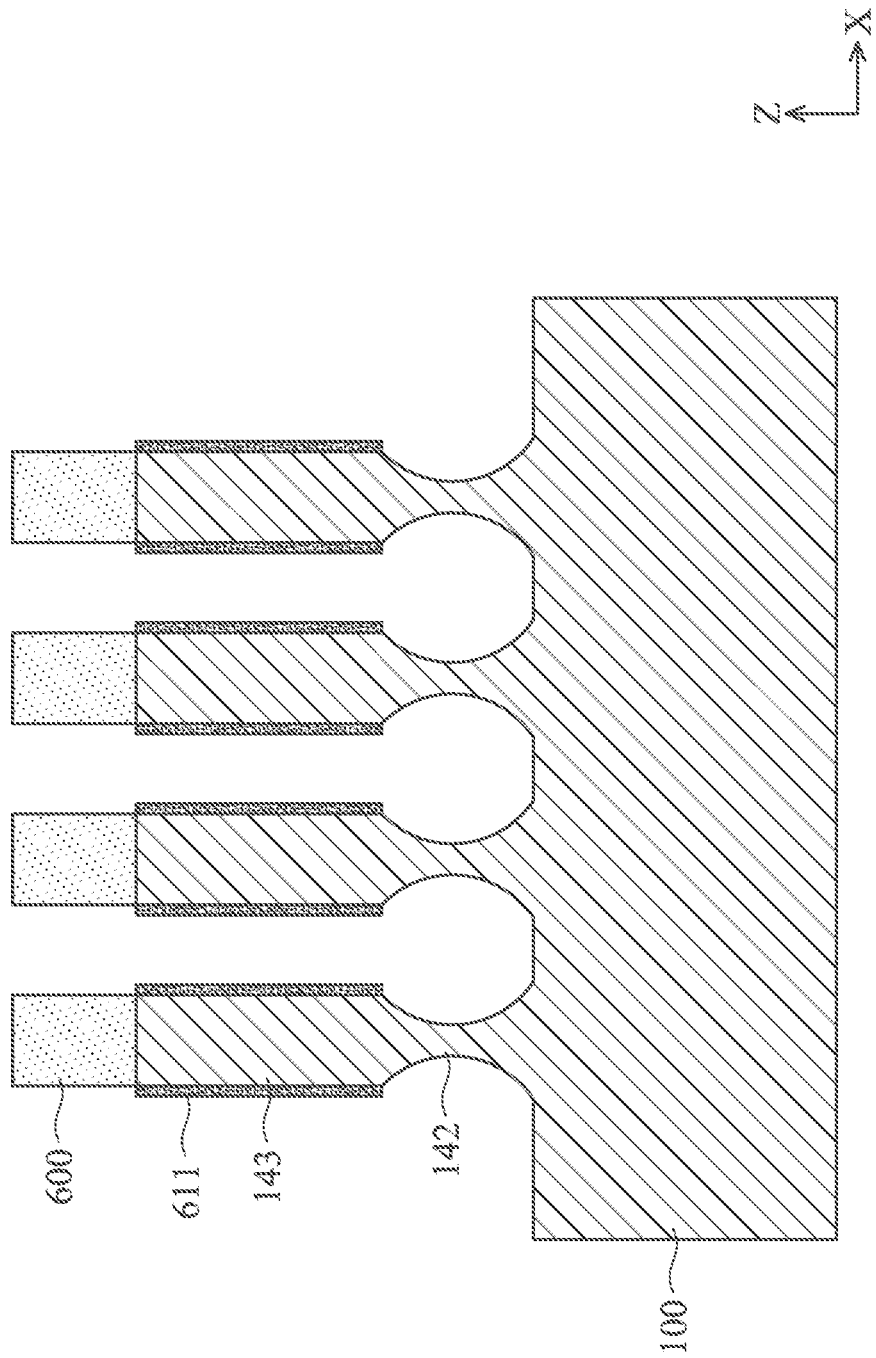
FIG. 6D shows a process step to manufacture the semiconductor fin structure shown in FIG. 4.

Next, as shown in FIG. 6D, the neck portion 142 is formed by isotropic plasma etching of the substrate 100 using $SF_6$ and $O_2$ with a predetermined ratio (pressure from about 10 mTorr to about 80 mTorr, source power from about 300 W to about 1000 W, and bias power from about 500 W to about 2000 W) with the hardmask layer 600 and a top portion protection layer 611 of the mask layer 610 as a plasma etching mask layer. In some embodiments, since a plasma etching rate to portions of the mask layer 610 covering the substrate 100 is greater that a plasma etching rate to portions of the mask layer 610 covering the side surfaces of the top portion 143, the substrate 100 is exposed by the plasma etching while the portions of the mask layer 143 on the side surfaces of the top portion 143 still remains to protect top portion 143. In this case, a bowl shape is formed in the substrate 100 on a level below the top portion 143, since the plasma etching to form the neck portion 142 can be controlled to relatively more isotropically etching the substrate 100 by using a mixture of $SF_6$ and $O_2$ with a predetermined ratio. Accordingly, the neck portion 142 under the top portion 143 is formed when adjacent bowl shapes are formed in the substrate 100.

Figure 6E:
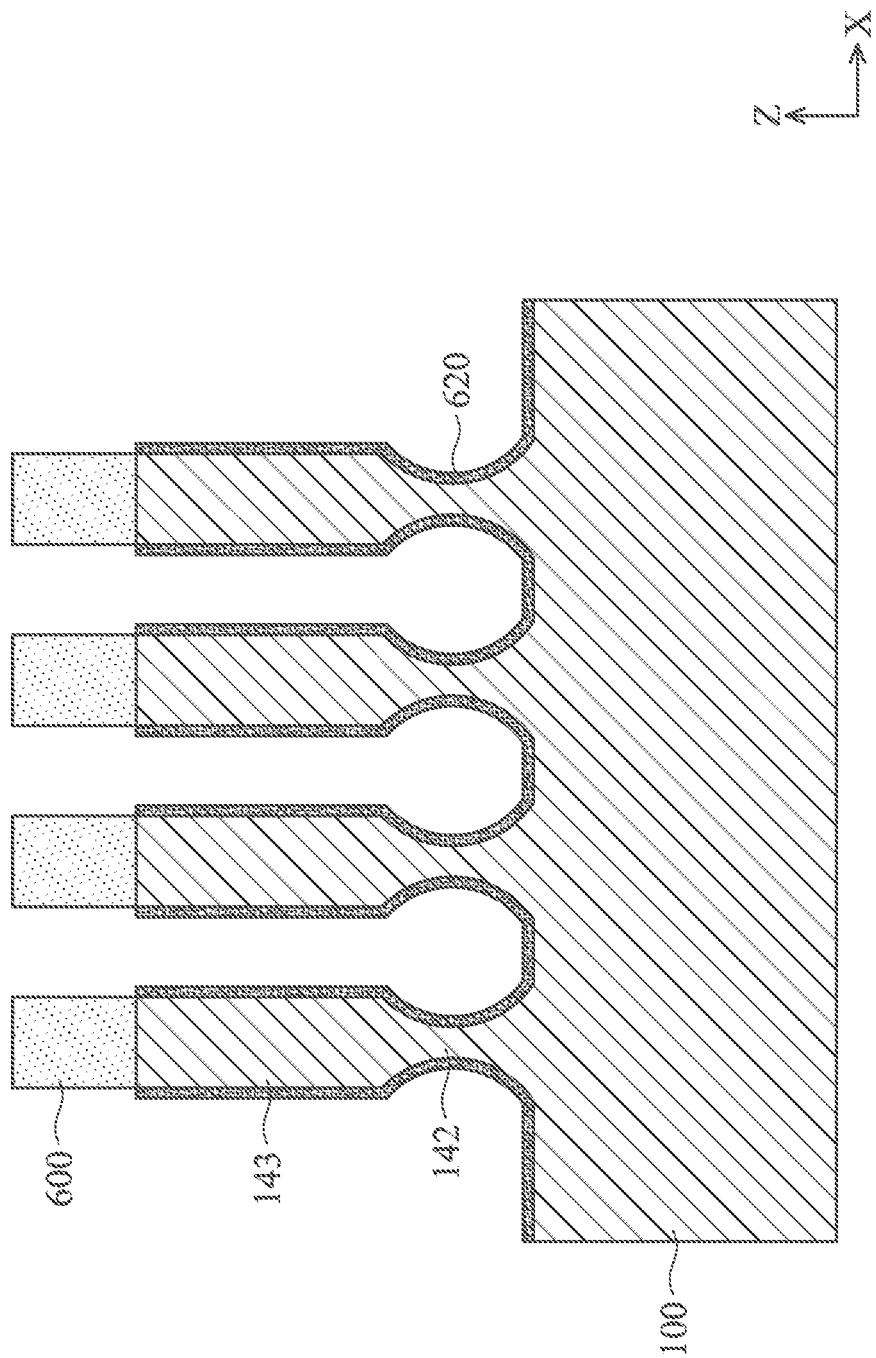
FIG. 6E shows a process step to manufacture the semiconductor fin structure shown in FIG. 4.

Next, as shown in FIG. 6E, another mask layer 620, for example, a $SiO_2$ layer, is formed, for example, by oxygen plasma oxidation (pressure about 10 mTorr to about 20 mTorr, source power from about 600 W to about 800 W, and bias power from about 0 W to about 100 W), to cover at least the surface of the substrate 100 and the side surfaces of the neck portion 142 exposed by the plasma etching performed with reference to FIG. 6D.

After the process shown in FIG. 6D and before the process shown in FIG. 6E, the top portion protection layer 611 can be kept on the side surface of top portion 143. Alternatively or optionally, after the process shown in FIG. 6D and before the process shown in FIG. 6E, the top portion protection layer 611 can be removed from the side surface of top portion 143. In this case, the exposed side surfaces of the top portion 143 can also be covered by the mask layer 620.

Figure 6F:
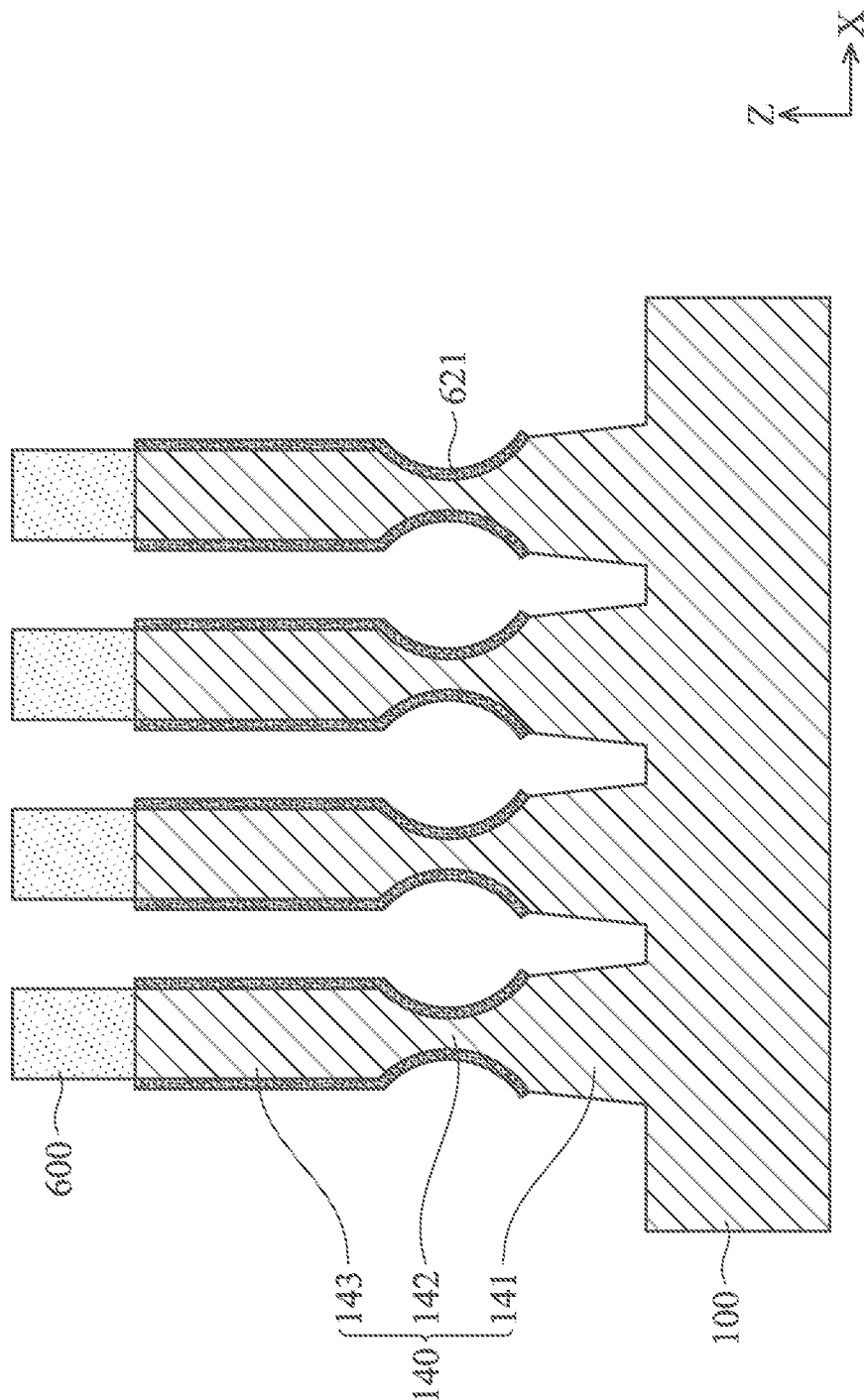
FIG. 6F shows a process step to manufacture the semiconductor fin structure shown in FIG. 4.

Thereafter, as shown in FIG. 6F, the bottom portion 141 is formed by plasma etching of the substrate 100 using $CF_4$, HBr, $Cl_2$, and/or $O_2$ with a predetermined ratio (pressure about 10 mTorr to about 200 mTorr, source power from 300 W to about 1000 W, and bias power about 500 W to about 2000 W). Thus, the semiconductor fin structure 141 including the bottom portion 141, the neck portion 142, and the top portion 143 is formed. In some embodiments, a plasma etching recipe, based on the aforementioned pressure, gases, and power, can be adjusted after forming the neck portion 142 so as to form the bottom portion 141. To save manufacturing time and cost, the substrate 100 can be kept in the plasma etching chamber without being taken out from the plasma etching chamber during the formation of the neck portion 142 and the bottom portion 141, although the present disclosure is not limited thereto. In some embodiments, the plasma etching to form the tapered bottom portion 141 can use a mixture of $CF_4$, HBr, $Cl_2$, $SF_6$, and/or $NF_3$ with a predetermined ratio.

Next, as shown in FIG. 6G, all the mask layers including the hardmask layer 600 and the top and neck portion protection layer 621 are removed.

In a case in which the semiconductor fin 140 does not include the aforementioned bottom portion 141 (that is, the neck portion 142 directly protrudes from the substrate 100), the processes described with reference to FIGS. 6E-6F can be omitted.

FIGS. 7A-7F show process steps to manufacture a FinFET, according to embodiments of the present disclosure, based on the semiconductor fin structure 140 manufactured by the process steps shown in FIGS. 6A-6G.

Each of FIGS. 7A to 7F includes a left drawing, which has the same view direction as that of FIGS. 6A-6G, and a right drawing, which is a cross-sectional view along line A-A' of the left drawing.

Figure 7A:
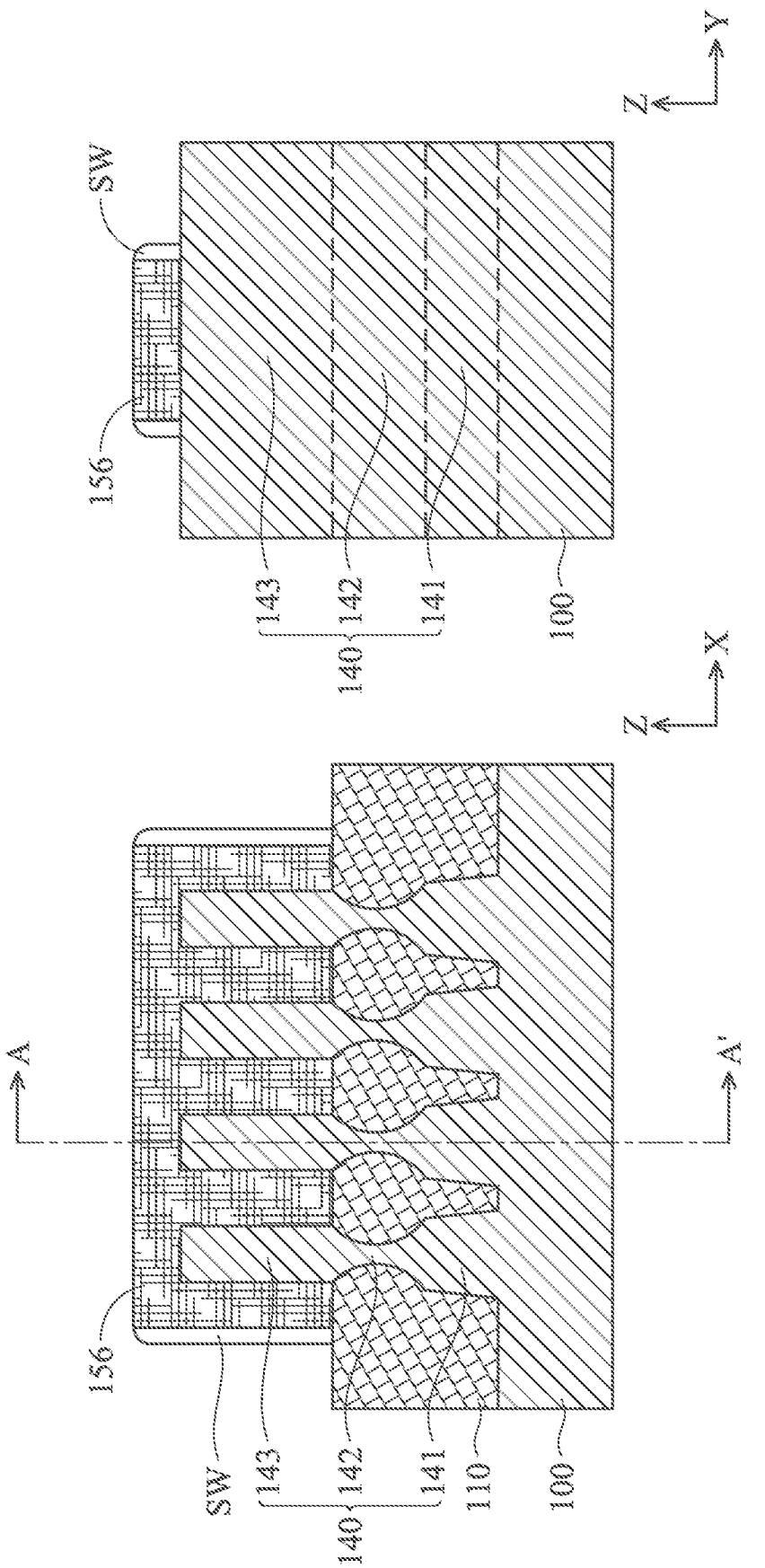
FIG. 7A shows a process step to manufacture a fin field-effect transistor (FinFET) according to embodiments of the present disclosure.

As shown in FIG. 7A, an isolation layer 110 is formed by filling an insulating material, such as $SiO_2$, between lower portions of the spaces between adjacent semiconductor fin structures 140. The isolation layer 110 can act as shallow trench isolation (STI). One of ordinary skill in the art should understand that an upper surface of the isolation layer 110 is at the same level as the interface between the top portion 143 and the neck portion 142 as shown in FIG. 7A is merely an example. The present disclosure should not be limited thereto. Then, a dummy gate layer 156 is formed on the isolation layer 110 to define the channel region 153 (shown in FIG. 8). A spacer SW can be formed on side surfaces of the dummy gate layer 156.

Figure 7B:
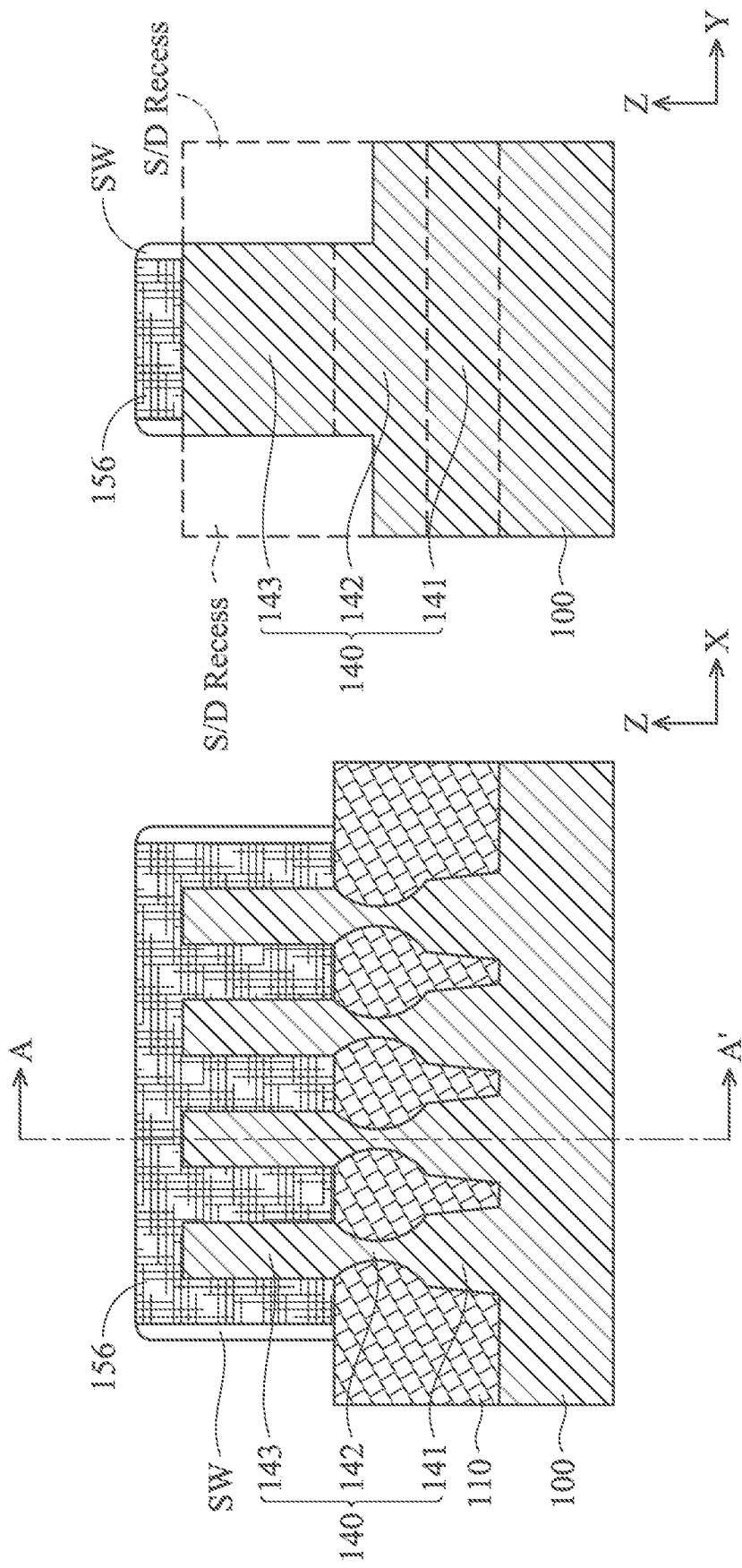
FIG. 7B shows a process step to manufacture a FinFET according to embodiments of the present disclosure.

Referring to FIG. 7B, a selective etching is performed such that portions of the semiconductor fin structure 140 not covered by the dummy gate layer 156 and the spacer SW are etched. By this etching, S/D recesses can be formed on opposite sides of the dummy gate layer 156.

Figure 7C:
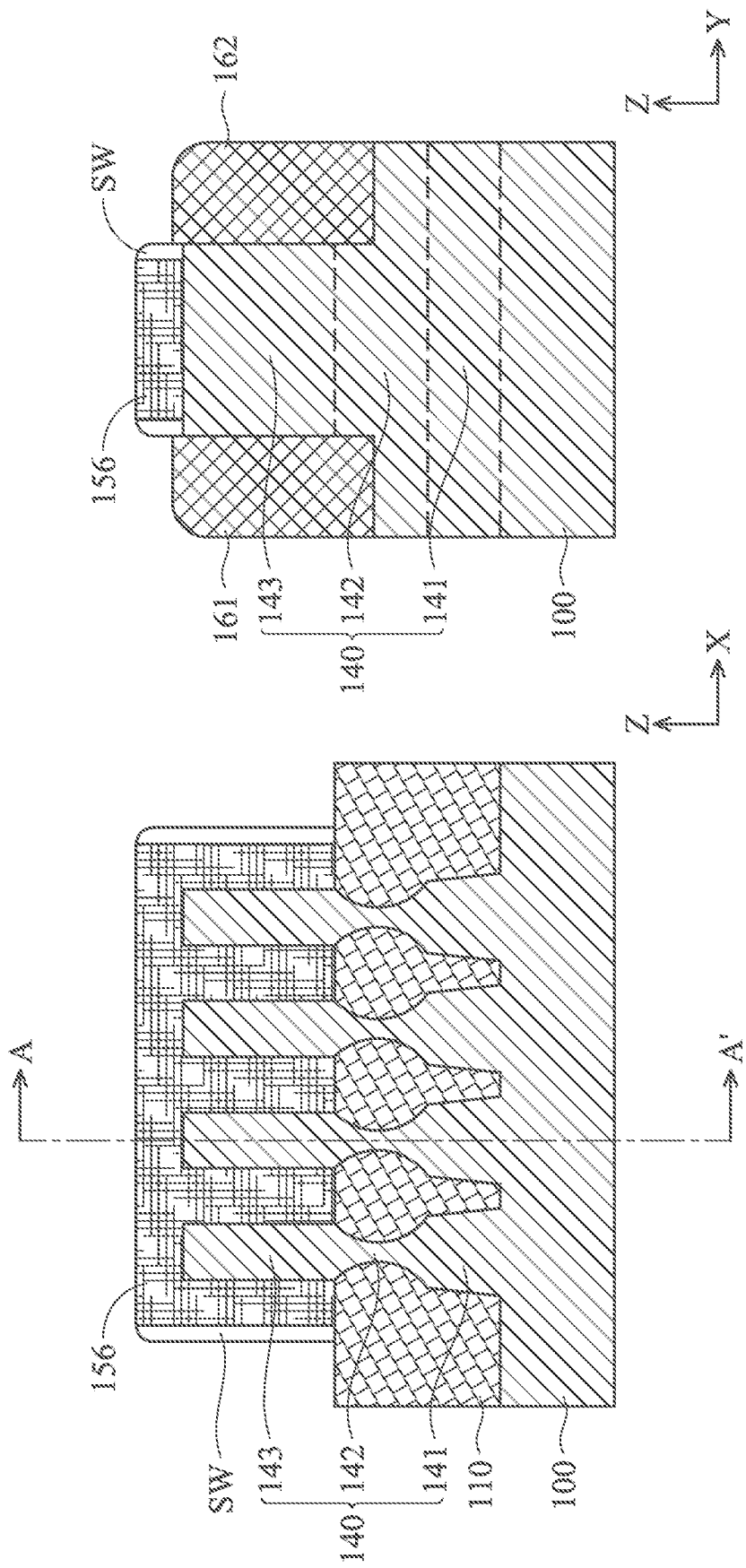
FIG. 7C shows a process step to manufacture a FinFET according to embodiments of the present disclosure.

Referring to FIG. 7C, an epitaxy layer is grown from an exposed portion of the semiconductor fin 140 to fill the S/D recesses, such that the source region 161 and the drain region 162 are formed on the opposite sides of the dummy gate layer 156.

Figure 7D:
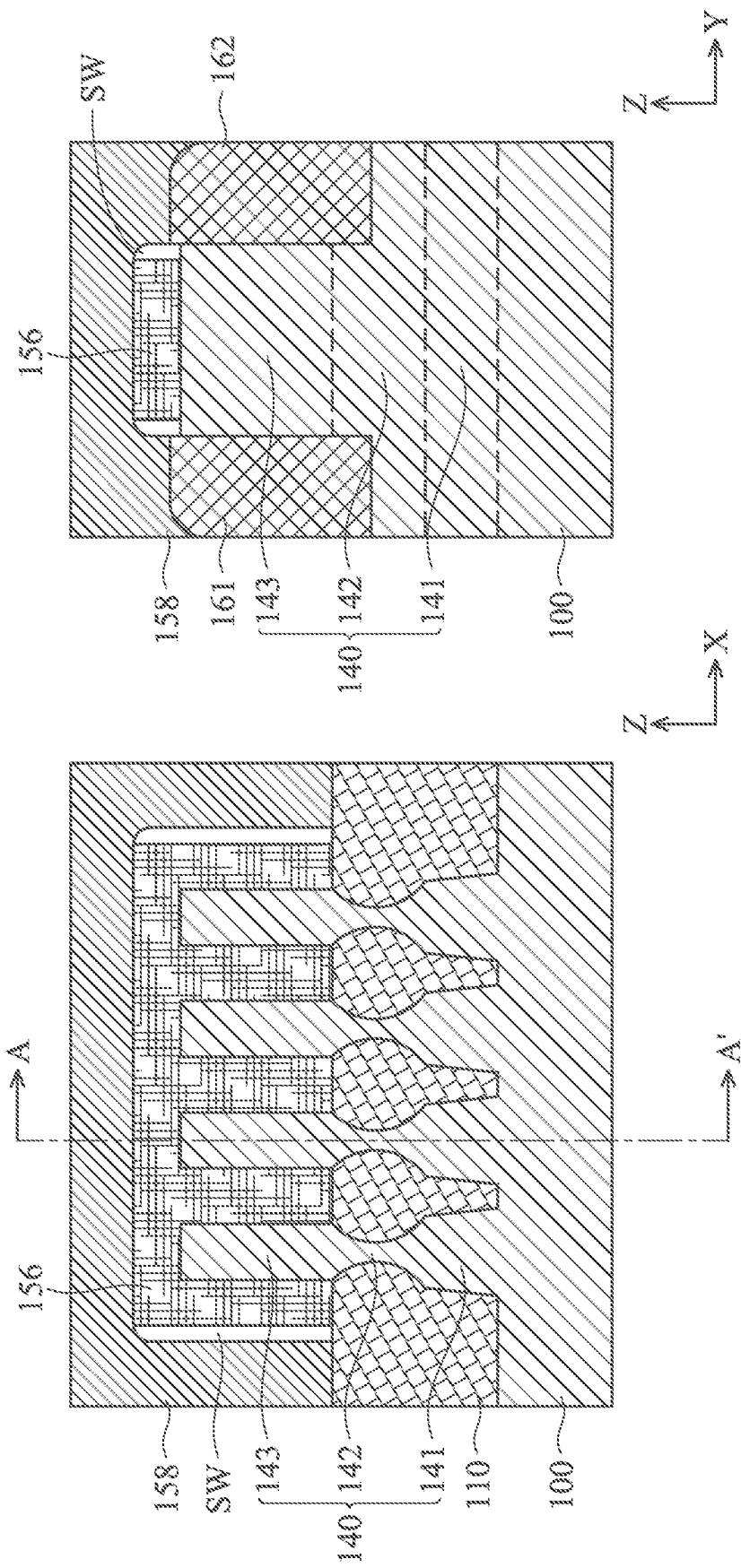
FIG. 7D shows a process step to manufacture a FinFET according to embodiments of the present disclosure.

Referring to FIG. 7D, an interlayer dielectric 158 is grown to cover the previous processed surface. The interlayer dielectric layer 158 fills spaces between the dummy gate layer 156, the source region 161, and the drain region 162, and covers the dummy gate layer 156, the source region 161, and the drain region 162.

Figure 7E:
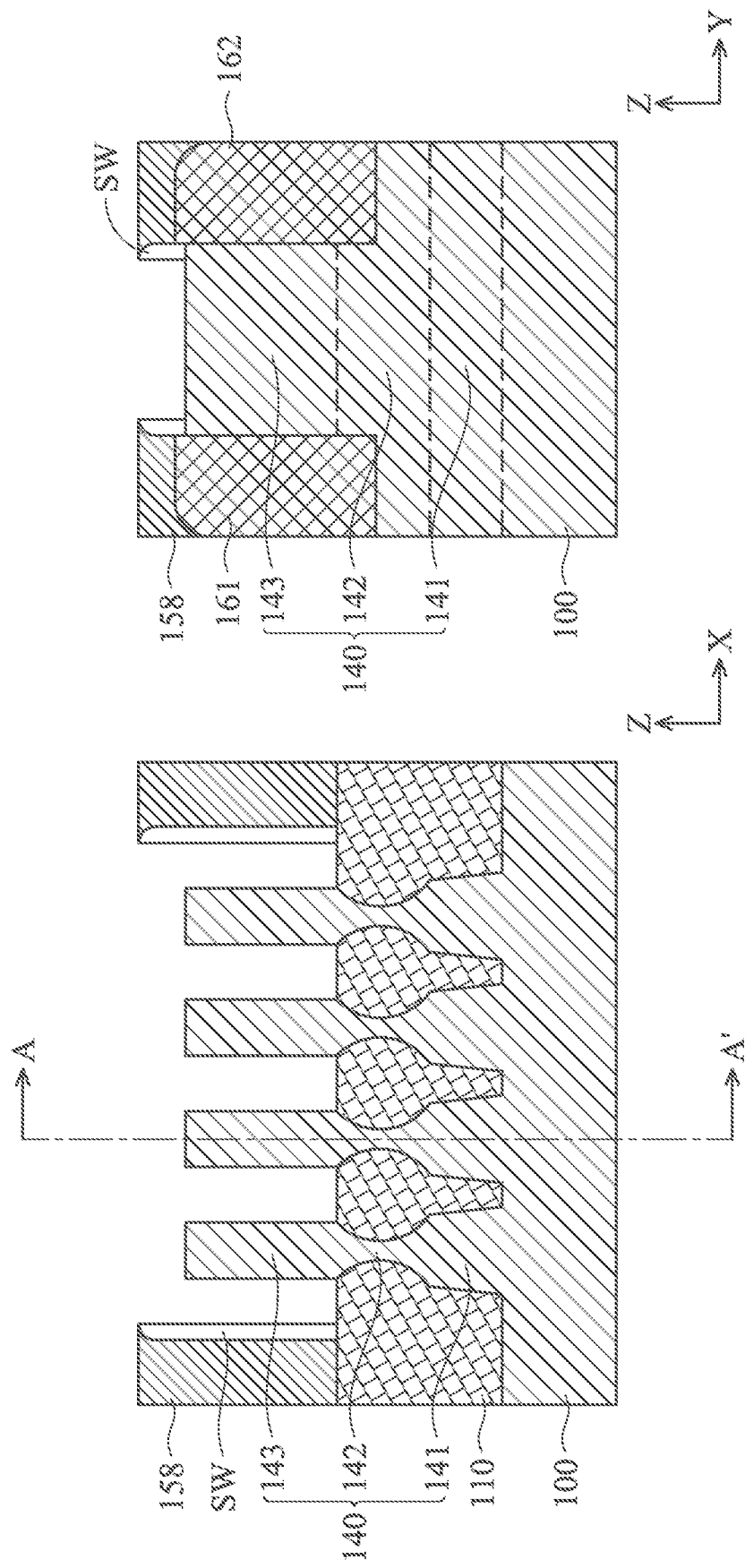
FIG. 7E shows a process step to manufacture a FinFET according to embodiments of the present disclosure.

Referring to FIG. 7E, appropriate operation, such as chemical mechanical polishing/planarization (CMP), is performed to expose the upper surface of the dummy gate layer 156, and then the dummy gate layer 156 is removed to expose the channel region.

Figure 7F:
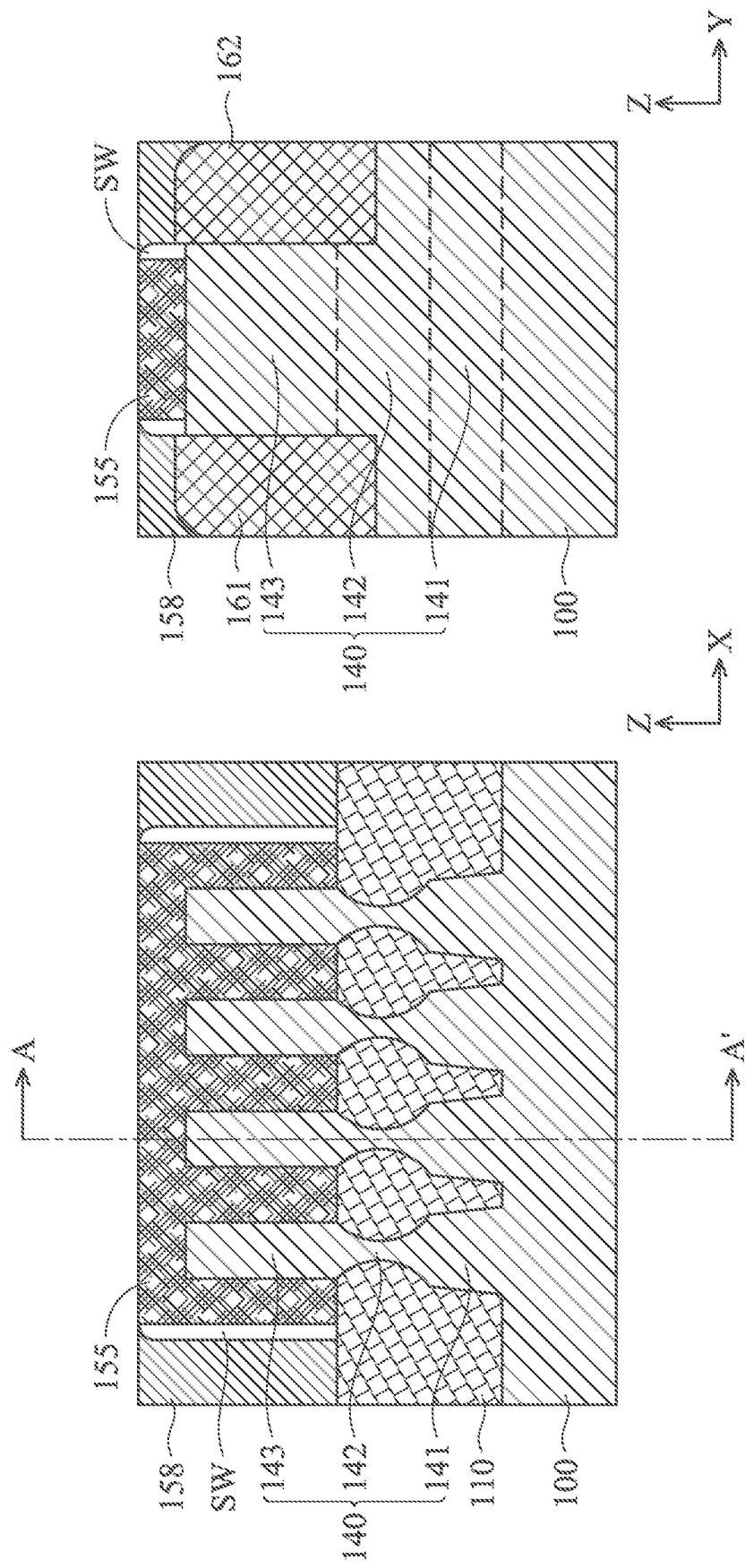
FIG. 7F shows a process step to manufacture a FinFET according to embodiments of the present disclosure.

Referring to FIG. 7F, a high-K dielectric layer (not shown) is formed to cover the exposed portion of the semiconductor fin structure 140. In some embodiments, an interfacial dielectric layer (not shown) can be formed on the exposed portion of the semiconductor fin structure 140 before forming the high-K dielectric layer. Thereafter, a gate electrode 155 is formed on the high-K dielectric layer.

One of ordinary skill in the art should understand that the above process steps described with reference to FIGS. 7A-7F are merely an example to manufacture an FinFET. The present disclosure should not be limited thereto.

Figure 8:
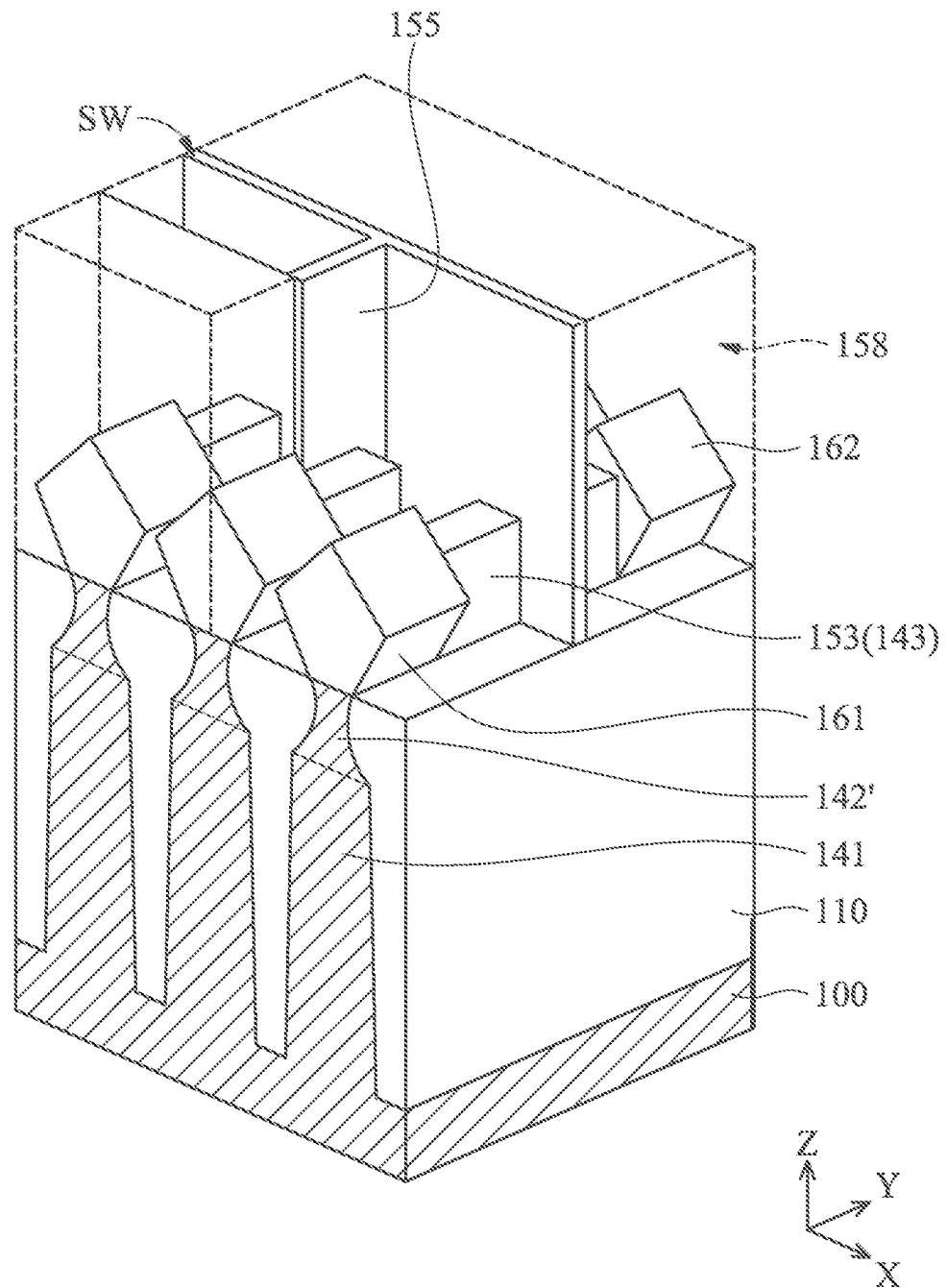
FIG. 8 shows a three-dimensional schematic view of a FinFET according to embodiments of the present disclosure.

FIG. 8 shows a three-dimensional schematic view of a FinFET, in which a portion of an interlayer dielectric 158 is partially exposed for illustration purpose, according to embodiments of the present disclosure. The FinFET can be manufactured based on the above processes described with reference to FIGS. 6A-7F.

Referring to FIG. 8, the FinFET includes a channel region 153 made of a top portion 143 of a semiconductor fin structure, a source region 161 and a drain region 162 disposed on opposite sides of the channel region 153 and made of an epitaxial layer filling a recess by removing a corresponding portion of the top portions 143, or by removing the top portion 143 and a portion of the structure including the neck portion 142 (not labeled in FIG. 8) and the bottom portion 141.

As shown in FIG. 8, the semiconductor fin structure also includes a neck portion 142', a portion of which can be made of the filled epitaxial layer and another portion of which can be made of the remaining portion of the neck portion 141 (not labeled in FIG. 8) and a bottom portion 141. Descriptions of the top portion 143, the neck portion 142, and the bottom portion 141, of the semiconductor fin structure, an isolation layer 110 and a substrate 100, based on which the semiconductor fin structure are formed, can be referred to the above descriptions and therefore will be omitted to avoid redundancy. Although not shown in FIG. 8, the FinFET can also include a gate insulating layer disposed between a gate electrode 143 and the channel region 153. The description of the gate insulating layer and the gate electrode 143 can be referred to the descriptions with reference to FIGS. 1-3.

Whether the source region 151 and the drain region 152 (shown in FIG. 1) are made of the semiconductor fin structure 140 or made of the source region 161 and the drain region 162 (shown in FIG. 8) are made of an epitaxy layer filling the recesses in the semiconductor fin structures 140, the portion of the semiconductor fin structures 140 below the gate electrode 155 and the gate insulating layer 154 can be the same. That is, regardless of whether the source region and the drain region are made of the semiconductor fin structure 140 or made of epitaxy layers filling the recess in the semiconductor fin structure 140, a cross-sectional view of the portion of the semiconductor fin structures 140 below the gate electrode 155 and the gate insulating layer is the same as that shown in FIG. 2.

One of ordinary skill in the art should appreciate that the source region 161 and the drain region 162 made of an epitaxy layer and the neck portion 142 having common interfaces as shown in FIG. 8 is merely an example and the present disclosure should not be limited thereto. In some embodiments, the source region 161 and drain region 162 can be formed deeper into a portion of the neck portion 142, or into the entire neck portion 142, or even into a portion of the bottom portion 141, dependent on design particulars. In other embodiments, the source region 161 and drain region 162 can be formed shallower by remaining a portion of the top portion 143 on the neck portion, dependent on design particulars.

FIGS. 9A-9E show process steps to manufacture the semiconductor fin structure shown in FIG. 5. For convenience of description, a silicon based semiconductor substrate and a silicon based semiconductor fin structure protruding from the silicon based semiconductor substrate will be described next. One of ordinary skill in the art, however, should appreciate that the substrate should not be limited to silicon, and that the semiconductor fin structure can be formed of other semiconductor material other than silicon by modifying the process conditions and applied materials to be described below.

Figure 9A:
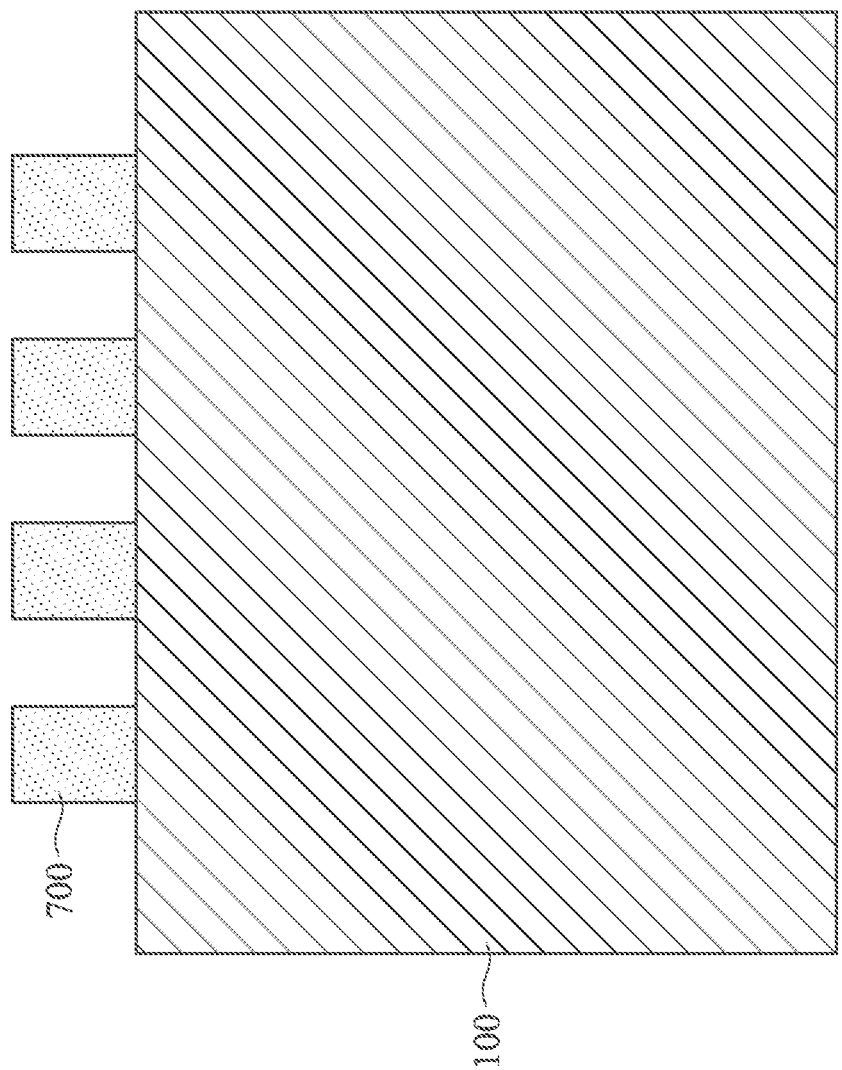
FIG. 9A shows a process step to manufacture the semiconductor fin structure shown in FIG. 5.

As shown in FIG. 9A, a hardmask layer 700 including one of a $SiO_2$ layer formed, a $Si_3N_4$ layer, and a SiON layer, or a combination thereof disposed on the substrate 100 which is, for example, a silicon substrate, is patterned.

Figure 9B:
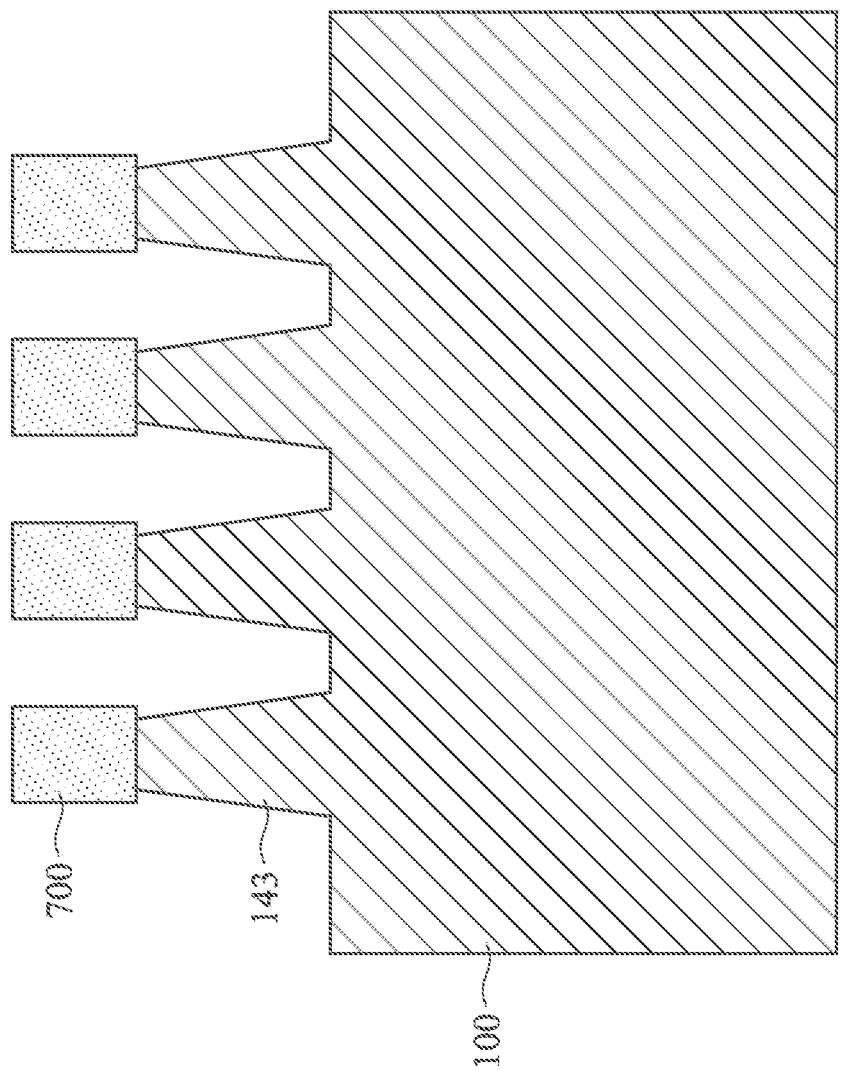
FIG. 9B shows a process step to manufacture the semiconductor fin structure shown in FIG. 5.

Thereafter, as shown in FIG. 9B, the top portion 143 is formed by a plasma etching using HBr, $Cl_2$, and $O_2$ with a predetermined ratio can be used (pressure from about 10 mTorr to about 200 mTorr, source power from about 300 W to about 1000 W, and bias power from about 500 W to about 2000 W) with the hardmask layer 700 as an etching mask layer. The width of the top portion 143, as described above, can gradually increase in a direction toward the substrate 100, although the present disclosure is not limited thereto.

Figure 9C:
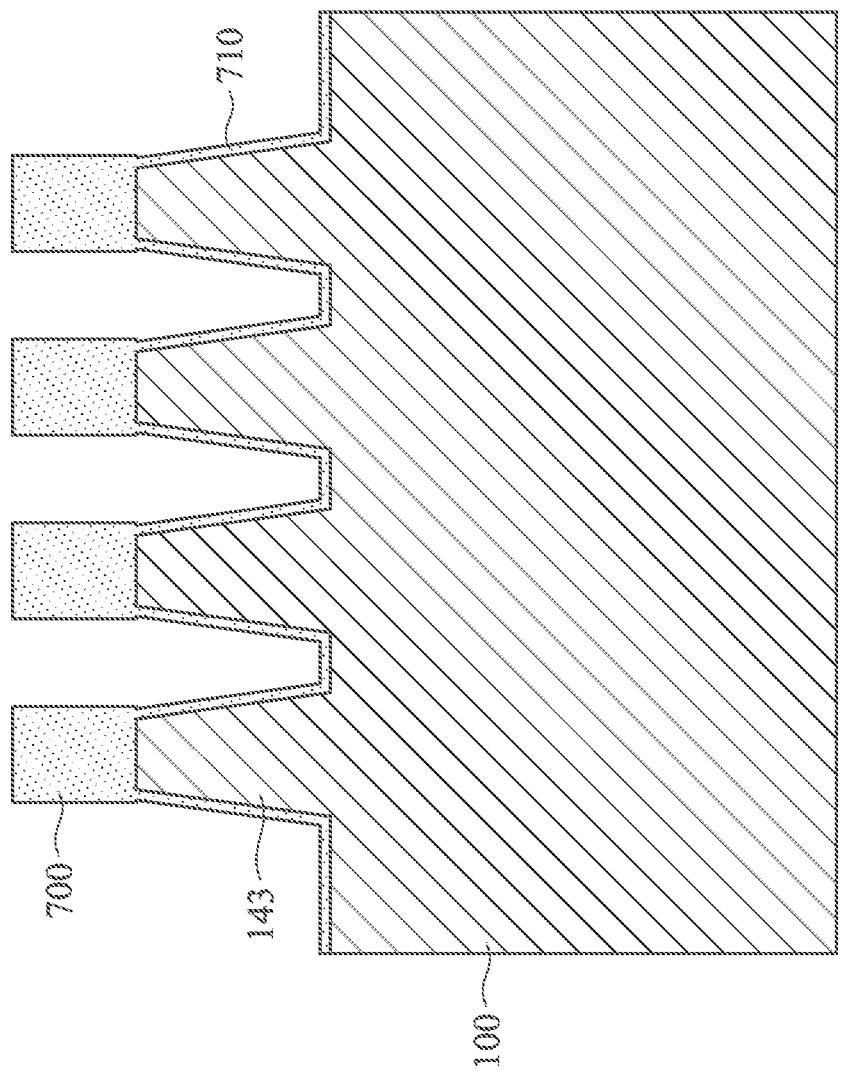
FIG. 9C shows a process step to manufacture the semiconductor fin structure shown in FIG. 5.

Next, as shown in FIG. 9C, another mask layer 710, for example, a $SiO_2$ layer, is formed, for example, by oxygen plasma oxidation (pressure about 10 mTorr to about 20 mTorr, source power from about 600 W to about 800 W, and bias power from about 0 W to about 100 W), to cover at least the surface of the substrate 100 and the surface of the top portion 143 exposed by the plasma etching performed with reference to FIG. 9B.

Figure 9D:
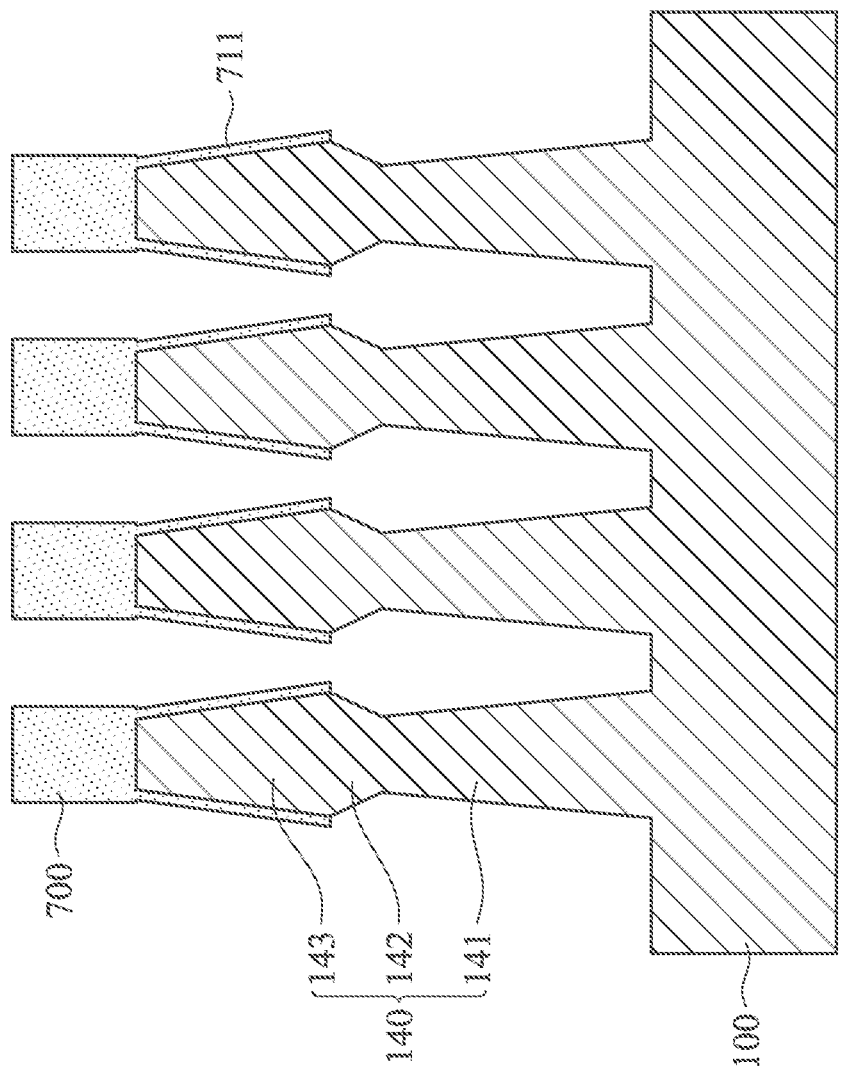
FIG. 9D shows a process step to manufacture the semiconductor fin structure shown in FIG. 5.

With reference to FIG. 9D, plasma etching is performed by using $CF_4$ and at least one of $CH_2F_2$ or $O_2$ with a predetermined ratio (pressure about 10 mTorr to about 20 mTorr, source power about 600 W to about 800 W, and bias power from about 100 W to about 500 W) such that portions of the mask layer 710 formed on the surface of the substrate 100 can be removed so as to expose the substrate 100. In this case, the remaining portion of the mask layer 710 becomes a top portion protection layer 711 covering side surfaces of the top portion 143. The neck portion 142 and the bottom portion 141 are formed by a plasma etching using $CF_4$, $NF_3$, $SF_6$, HBr, and $Cl_2$ with a predetermined ratio (pressure from about 10 mTorr to about 200 mTorr, source power from about 300 W to about 1000 W, and bias power from about 500 W to about 2000 W) with the hardmask layer 700 and the top portion protection layer 711 as an etching mask layer. In some embodiments, the plasma etching for forming the neck portion 142 is isotropic etching and the plasma etching for forming the bottom portion 143 is anisotropic etching. According to some embodiments, a plasma etching selectivity of the substrate 100 to the top portion protection layer can be adjusted in a range, for example, from 5 to 10 (i.e, the etching rate of the substrate 100 is 5 to 10 times the etching rate of the top portion protection layer 711 by the plasma etching), or greater, by adjusting a mixture of $CF_4$, $NF_3$, $SF_6$, HBr, and/or $Cl_2$ and/or a source power and bottom power condition in the plasma etch chamber. That is, during the etching of the substrate 100, the top portion protection layer 711 is also etched. In some embodiments, $CF_4$ used to break through the portion of the mask layer 710 covering the substrate 100 can be mixed with other gases to form the neck portion 142 and slowly etch the top portion protection layer 711. Although vertical and lateral etching of the substrate material can occur simultaneously during the forming of the neck portion 142 and the bottom 141, vertical etching of the substrate material with ion-bombardment has a greater etch rate than the lateral etching of the substrate material. An etching by-product (which is less volatile than plasma) can be deposited to the sidewall of the formed portion by the plasma etching, so as to prevent or reduce the lateral etching of the substrate material during forming of the neck portion 142. On the other hand, after a certain etching period to form the neck portion 142, the by-product deposited to the sidewall of the neck portion 142 can be etched and the substrate material is further etched, by adjusting the plasma etching condition including, for example, the mixture of the above mentioned gases and the source power and bottom power condition, so as to form the bottom portion 141. Since a portion of the material of the formed neck portion 142 can be etched by the plasma etching during the formation of the bottom portion 141, the neck portion 142 can have a size decreasing while the bottom portion 141 can have a size increasing in the vertical direction from the top portion 143 to the bottom portion 141.

Next, as shown in FIG. 9E, all the mask layers including the hardmask layer 700 and the top portion protection layer 711 are removed.

In a case in which the semiconductor fin 140 does not include the aforementioned bottom portion 141 (that is, the neck portion 142 directly protrudes from the substrate 100), the process described with reference to FIG. 9D can be modified to not form the bottom portion 141.

Figure 10:
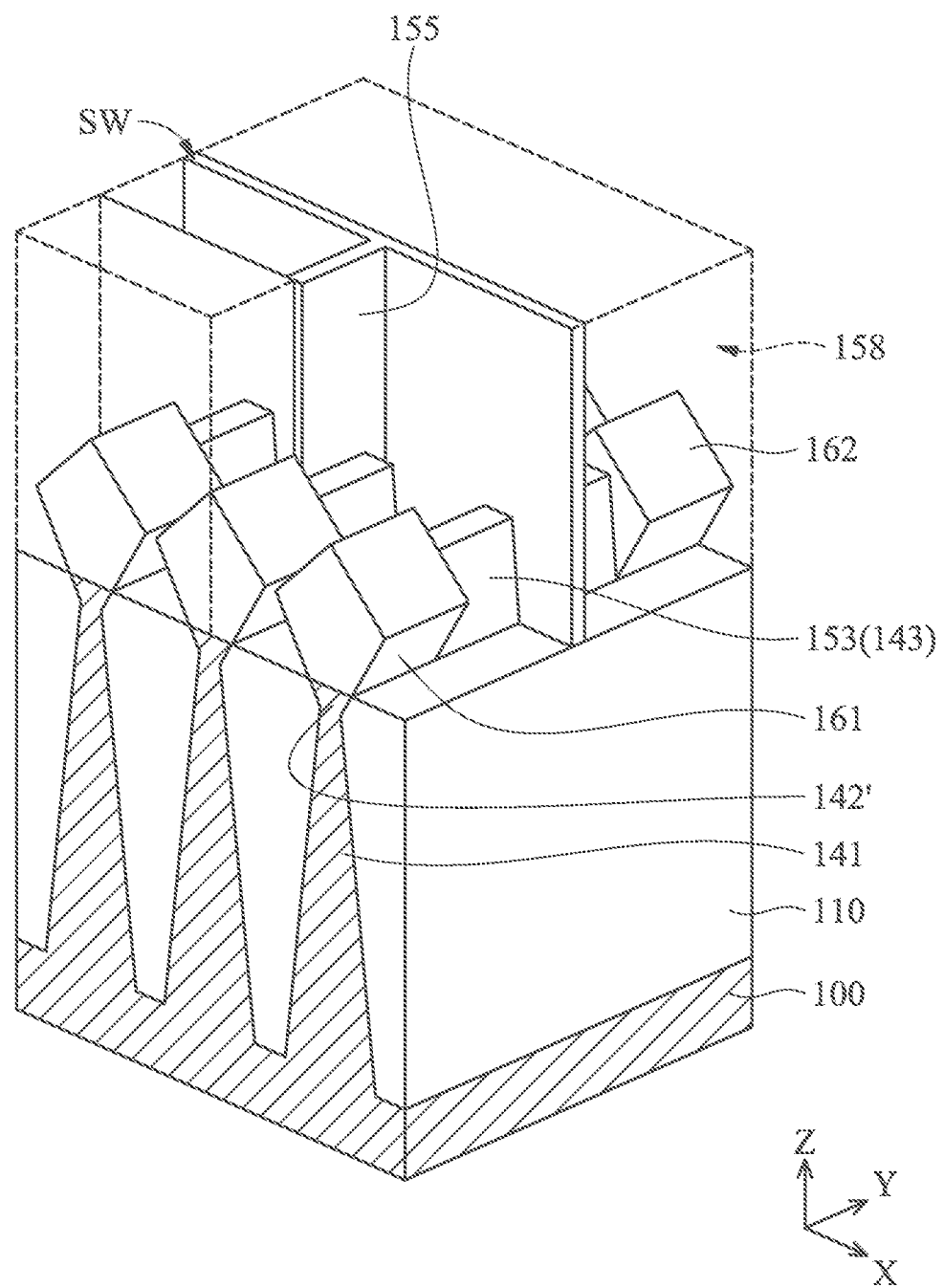
FIG. 10 shows a three-dimensional schematic view of a FinFET according to embodiments of the present disclosure.

The semiconductor fin structure manufactured by the process steps shown in FIGS. 9A-9E can also be used to manufacture a FinFET shown in FIG. 10, in which a portion of an interlayer dielectric 158 is partially exposed for illustration purpose.

The FinFET shown in FIG. 10 is substantially the same as the FinFET shown in FIG. 8, except that the semiconductor fin structures are different. Descriptions of the FinFET shown in FIG. 10 can be referred to the above descriptions with reference to FIG. 8. To avoid redundancy, detailed descriptions will be omitted.

One of ordinary skill in the art should understand that the above processes described with reference to FIGS. 7A-7F can be used to manufacture the FinFET shown in FIG. 10 based on the semiconductor fin structures manufactured by the processes shown in FIGS. 9A-9E. Detailed manufacturing processes will be omitted to avoid redundancy.

According to an aspect of the present disclosure, a FinFET formed of a semiconductor fin structure including a neck portion can have a reduced below-channel current leakage, as compared to another FinFET having the same configuration except that the other FinFET is formed of another semiconductor fin structure without a neck portion.

According to another aspect of the present disclosure, to reduce channel current leakage, a FinFET formed of a semiconductor fin structure including a neck portion can be manufactured from, for example, a silicon substrate, rather than a more expensive SOI substrate. As compared to a FinFET made from an SOI substrate, the FinFET according to embodiments of the present disclosure can have reduced below-channel current leakage, similar to a comparative example made from an SOI substrate, but with a reduced cost, since a cheaper substrate is used.

According to another aspect of the present disclosure, to reduce below-channel current leakage, a FinFET formed of a semiconductor fin structure including a neck portion can be manufactured from, for example, a silicon substrate. As compared to a FinFET made from a silicon substrate having a punch-through stopper formed by implantation (a process which is more difficult to control than the aforementioned process) or a buried oxide below the channel region so as to reduce below-channel current leakage, the FinFET according to embodiments of the present disclosure can also reduce below-channel current leakage but does not require relatively complicated and difficult processes to form a punch-through stopper or a buried oxide.

According to one aspect of the present disclosure, a semiconductor device includes a substrate, a fin structure protruding from an isolation insulating layer disposed over the substrate, a gate insulating layer covering a channel region formed of the fin structure, and a gate electrode layer covering the gate insulating layer. The fin structure includes a bottom portion, a neck portion, and a top portion sequentially disposed on the substrate. A width of the neck portion is less than a width of the bottom portion and a width of a portion of the top portion. In one embodiment, the neck portion includes a narrowest portion of the fin structure. In one embodiment, the width of the neck portion increases along a direction in which the fin structure protrudes from the substrate, a side surface of the neck portion has an arcuate shape, and portions, between which the neck portion is disposed, has flat side surfaces. In one embodiment, the width of the bottom portion increases along a direction in which the fin structure protrudes from the substrate. In one embodiment, the width of the top portion decreases along a direction in which the fin structure protrudes from the substrate. In one embodiment, a width of a narrowest portion of the neck portion is from about 2 nm to about 11 nm. In one embodiment, a thickness of the neck portion is from about 6 nm to about 14 nm. In one embodiment, a width of an uppermost portion of the fin structure is greater than a width of a narrowest portion of the neck portion. In one embodiment, the bottom portion, the neck portion, and the top portion are formed of substantially the same material. In one embodiment, side surfaces of the bottom portion, the neck portion, and a lower portion of the top portion are covered by the isolation layers. In one embodiment, the gate electrode is formed on a level at least above a narrowest portion of the neck portion.

According to one aspect of the present disclosure, a method for forming a semiconductor fin structure includes forming a top portion of the semiconductor fin structure by etching a substrate, forming a first mask layer on a side surface of the top portion and a surface of the substrate, forming a neck portion of the semiconductor fin structure by etching the substrate while a portion of the first mask layer covers the top portion of the semiconductor fin structure to protect the top portion, forming a second mask layer at least on a side surface of the neck portion and an exposed surface of the substrate by etching, and forming a bottom portion of the semiconductor fin structure by etching the substrate while a portion of the second protection layer covers the top and neck portions of the semiconductor fin structure to protect the top and neck portions. Forming the neck portion is performed by isotropic etching of the substrate. In one embodiment, a narrowest portion of the semiconductor fin structure is a portion of the neck portion. In one embodiment, the top portion, the neck portion, and the bottom portion are formed of substantially the same semiconductor material. In one embodiment, the method further includes forming an isolation insulating layer on opposite sides of the semiconductor fin structure.

According to one aspect of the present disclosure, a method for forming a semiconductor fin structure includes forming a first fin on a substrate, forming a mask layer on surfaces of the first fin and the substrate, and etching portions of the substrate by using a portion of the mask layer as an etching protection layer so as to form a second fin below the first fin. The second fin has a width first decreasing and then increasing in a direction from the second fin to the first fin. In one embodiment, a width of the first fin increases in a direction from the first fin to the second fin. In one embodiment, a narrowest portion of the first fin and the second fin is a portion of the second fin. In one embodiment, the first fin and the second fin are formed of substantially the same semiconductor material. In one embodiment, the method further includes forming an isolation insulating layer on opposite sides of the semiconductor fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a fin structure protruding from an isolation insulating layer disposed over the substrate;
a gate insulating layer covering a channel region formed of the fin structure; and
a gate electrode layer covering the gate insulating layer;

wherein the fin structure includes a bottom portion, a neck portion, and a top portion sequentially disposed on the substrate, the neck portion has an arcuate surface, an angle θ1 between a side surface of the bottom portion and a horizontal plane is an acute angle, an angle θ3 between a side surface of the top portion and a horizontal plane is substantially a right angle, a width of an uppermost portion of the fin structure is greater than a width of a narrowest portion of the neck portion, the narrowest portion of the neck portion is below a lowermost portion of the gate electrode layer along a direction in which the fin structure protrudes from the substrate, a width of the top portion decreases along a direction in which the fin structure protrudes from the substrate.

2. The semiconductor device of claim 1, wherein the bottom portion, the neck portion, and the top portion are formed of substantially a same material.

3. The semiconductor device of claim 1, wherein a thickness of the bottom portion ranges from 40 nm to 100 nm and a thickness of the top portion ranges from 10 nm to 80 nm.

4. The semiconductor device of claim 1, wherein the neck portion includes a narrowest portion of the fin structure.

5. The semiconductor device of claim 1, wherein a width of the bottom portion decreases along the direction in which the fin structure protrudes from the substrate.

6. The semiconductor device of claim 1, wherein a width of the narrowest portion of the neck portion is from 2 nm to 11 nm.

7. The semiconductor device of claim 1, wherein the gate insulating layer is a high-k dielectric layer.

8. A semiconductor device, comprising:
a substrate;
a fin structure protruding from an isolation insulating layer disposed over the substrate;
a gate insulating layer covering a channel region formed of the fin structure; and
a gate electrode layer covering the gate insulating layer;
wherein the fin structure includes a bottom portion, a neck portion, and a top portion sequentially disposed on the substrate,
the neck portion has an arcuate surface,
a curvature of a side surface of the bottom portion below a horizontal plane at an interface of the bottom portion and the neck portion is less than a curvature of the arcuate surface above the bottom portion,
a curvature of a side surface of the top portion above a horizontal plane at an interface of the top portion and the neck portion is less than a curvature of the arcuate surface below the top portion,
a width of an uppermost portion of the fin structure is greater than a width of a narrowest portion of the neck portion,
the narrowest portion of the neck portion is below a lowermost portion of the gate electrode layer along a direction in which the fin structure protrudes from the substrate, and a width of the top portion decreases along a direction in which the fin structure protrudes from the substrate.

9. The semiconductor device of claim 8, wherein the bottom portion, the neck portion, and the top portion are formed of substantially a same material.

10. The semiconductor device of claim 8, wherein a width of the bottom portion decreases along the direction in which the fin structure protrudes from the substrate.

11. The semiconductor device of claim 8, wherein the neck portion includes a narrowest portion of the fin structure.

12. The semiconductor device of claim 8, wherein a width of a narrowest portion of the neck portion is from 2 nm to 11 nm.

13. A semiconductor device, comprising:
a fin disposed over a substrate;
a gate insulating layer covering a channel region formed of the fin; and
a gate electrode layer covering the gate insulating layer;
wherein the fin includes a bottom portion, a neck portion, and a top portion sequentially disposed on the substrate,
a width of the bottom portion decreases from an interface of the bottom portion and an upper surface of the substrate to an interface of the bottom portion and the neck portion,
a ratio of a width of the neck portion where the neck portion meets the bottom portion to a width of the neck portion where the neck portion meets the top portion ranges from 0.5 to 0.95,
a width of the top portion decreases from an interface of the top portion and the neck portion to an uppermost surface of the fin,
a ratio of a width at the uppermost surface of the fin to the interface of the top portion and the neck portion is greater than 0.9, and
a narrowest portion of the neck portion is below a lowermost portion of the gate electrode layer along a direction in which the fin protrudes from the substrate.

14. The semiconductor device of claim 13, wherein a width of an uppermost portion of the fin is less than a width of the narrowest portion of the neck portion.

15. The semiconductor device of claim 13, wherein the bottom portion, the neck portion, and the top portion are formed of substantially a same material.

16. The semiconductor device of claim 13, wherein a thickness of the bottom portion ranges from 40 nm to 100 nm and a thickness of the top portion ranges from 10 nm to 80 nm.

17. The semiconductor device of claim 13, wherein the width of the bottom portion decreases along the direction in which the fin protrudes from the substrate.

18. The semiconductor device of claim 13, wherein the top portion includes a narrowest portion of the fin.

19. The semiconductor device of claim 13, wherein a width of the top portion decreases along the direction in which the fin protrudes from the substrate.

20. The semiconductor device of claim 13, wherein a width of the neck portion increases along the direction in which the fin protrudes from the substrate.

* * * * *